(12) United States Patent
Oh et al.

(10) Patent No.: US 8,178,924 B2
(45) Date of Patent: May 15, 2012

(54) SEMICONDUCTOR DEVICE HAVING FLOATING BODY ELEMENT AND BULK BODY ELEMENT

(75) Inventors: Chang-Woo Oh, Gyeonggi-do (KR); Dong-Gun Park, Seoul (KR)

(73) Assignee: Samsung Electronic Co., Ltd. (KR)

(*) Notice: Subject to any disclaimer, the term of this patent is extended or adjusted under 35 U.S.C. 154(b) by 611 days.

(21) Appl. No.: 12/146,016

(22) Filed: Jun. 25, 2008

(65) Prior Publication Data
US 2009/0001503 A1    Jan. 1, 2009

(30) Foreign Application Priority Data

Jun. 28, 2007 (KR) .................. 10-2007-0064532

(51) Int. Cl.
*H01L 27/12* (2006.01)
(52) U.S. Cl. . 257/351; 257/347; 257/506; 257/E27.112; 257/E21.704
(58) Field of Classification Search .......... 257/347, 257/351, 506, E27.112, E21.704
See application file for complete search history.

(56) References Cited

U.S. PATENT DOCUMENTS

| | | |
|---|---|---|
| 5,057,450 A | 10/1991 | Bronner et al. |
| 5,227,658 A | 7/1993 | Beyer et al. |
| 5,306,659 A | 4/1994 | Beyer et al. |
| 5,391,911 A | 2/1995 | Beyer et al. |
| 5,675,185 A | 10/1997 | Chen et al. |
| 5,963,817 A | 10/1999 | Chu et al. |
| 5,972,758 A | 10/1999 | Liang |
| 6,414,355 B1 | 7/2002 | An et al. |
| 6,429,484 B1 * | 8/2002 | Yu .................. 257/347 |
| 6,448,115 B1 | 9/2002 | Bae |
| 6,461,903 B2 | 10/2002 | Lee |
| 6,657,258 B2 | 12/2003 | Bae |
| 6,664,598 B1 | 12/2003 | Dennard et al. |
| 6,670,212 B2 | 12/2003 | McNie et al. |
| 6,670,716 B2 * | 12/2003 | Christensen et al. ......... 257/762 |
| 6,878,978 B2 | 4/2005 | Dokumaci et al. |
| 6,946,314 B2 | 9/2005 | Sawyer et al. |
| 7,015,549 B2 * | 3/2006 | Kim et al. ............ 257/347 |

(Continued)

FOREIGN PATENT DOCUMENTS

JP    10-041512    2/1998

(Continued)

OTHER PUBLICATIONS

"A 4-Bit Double SONOS Memory (DSM) with 4 Storage Nodes Per Cell for Ultimate Multi-Bit Operation," Chang Woo Oh et al., 2006 Symposium on VLSI Technology Digest of Technical Papers, p. 58.

(Continued)

*Primary Examiner* — N Drew Richards
*Assistant Examiner* — John P Dulka
(74) *Attorney, Agent, or Firm* — Myers Bigel Sibley & Sajovec

(57) ABSTRACT

A semiconductor device having a floating body element and a bulk body element and a manufacturing method thereof are provided. The semiconductor device includes a substrate having a bulk body element region and floating body element regions. An isolation region defining an active region of the bulk body element region of the substrate and defining first buried patterns and first active patterns, which are sequentially stacked on a first element region of the floating body element regions of the substrate is provided. A first buried dielectric layer interposed between the first buried patterns and the substrate and between the first buried patterns and the first active patterns is provided.

19 Claims, 41 Drawing Sheets

U.S. PATENT DOCUMENTS

| | | | |
|---|---|---|---|
| 7,045,468 B2 | 5/2006 | Liang | |
| 7,052,948 B2 | 5/2006 | Murphy et al. | |
| 7,057,926 B2 | 6/2006 | Ohsawa | |
| 7,084,028 B2* | 8/2006 | Fukuzumi | 438/244 |
| 7,190,007 B2 | 3/2007 | Breitwisch et al. | |
| 7,629,651 B2* | 12/2009 | Nakajima | 257/347 |
| 2004/0058506 A1 | 3/2004 | Fujuzumi | |
| 2005/0186742 A1* | 8/2005 | Oh et al. | 438/283 |
| 2006/0118918 A1* | 6/2006 | Waite et al. | 257/627 |
| 2007/0246752 A1 | 10/2007 | Cheng et al. | |
| 2008/0029829 A1 | 2/2008 | Yang et al. | |
| 2008/0128811 A1 | 6/2008 | Furukawa et al. | |
| 2008/0142868 A1* | 6/2008 | Tak et al. | 257/315 |
| 2008/0211023 A1* | 9/2008 | Shino | 257/347 |
| 2010/0117152 A1* | 5/2010 | Oh | 257/347 |

FOREIGN PATENT DOCUMENTS

| | | |
|---|---|---|
| JP | 2004-104105 | 4/2004 |
| KR | 2002-0052458 A | 7/2002 |
| KR | 10-0353468 B1 | 9/2002 |

OTHER PUBLICATIONS

"A Novel Multi-Functional Silicon-On ONO (SOONO) MOSFETs for SoC Applications: Electrical Characterization for High Performance Transistor and Embeded Memory Applications," Chang Woo Oh et al., 2006 Symposium on VLSI Technology Digest of Technical Papers, p. 967.

"A Design of a Capacitorless 1T-DRAM Cell Using Gate-Induced Drain Leakage (GIDL) Current for Low-Power and High-Speed Embedded Memory," E. Yoshida et al., IEDM 2003, p. 913.

"Floating Body RAM Technology and Its Scalability to 32nm Node and Beyond," T. Shino et al., IEDM 2006, p. 569.

"A Study of Highly Scalable DG-FinDRAM," E. Yoshida et al., IEE Electron Device Letters, vol. 26, No. 9, Sep. 2005.

Korean Office Action, KR 10-2003-0085237, Aug. 31, 2005.

"Highly Scalable FBC (Floating Body Cell) with 25nm Box Structure for Embedded DRAM Applications," T. Shino et al., 2004 Symposium on VLSI Technology Digest of Technical Papers, p. 132-133.

"Floating Body DRAM Characteristics of Silicon-On-ONO (SOONO) Devices for System-on-Chip (SoC) Applications," Chang Woo Oh et al., 2007 Symposium on VLSI Technology Digest of Technical Papers, p. 168-169.

"4-Bit Double SONOS Memories (DSMs) Using Single-Level and Multi-Level Cell Schemes," Chang Woo Oh et al., IEEE 2006.

T. Tanaka et al., "Scalability Study on a Capacitorless 1T-DRAM: From Single-gate PD-SOI to Double-gate FinDRAM", IEEE 2004, 4 pages.

Y. Minami et al., "A Floating Body Cell (FBC) fully Compatible with 90nm CMOS Technology (CMOS IV) for 128Mb SOI DRAM", IEEE 2005, 4 pages.

B. McGaughy et al., Invited Talk 1: "Advanced Simulation Technology and its Application in Memor Design and Verification", Cadence Design System, IEEE 2005, 6 pages.

S. Okhonin et al., Invited Talk 2: "Zero Capacitor Embedded Memory Technology for System on Chip", Innovative Silicon, Inc., IEEE 2005, 5 pages.

M. Nagoga et al., "Retention Characteristics of Zero-capacitor RAM (Z-RAM) cell based on FinFET and Tri-Gate devices", IEEE 2007, 2 pages.

R. Ranica et al., "Scaled 1T-Bulk devices built with CMOS 90nm technology for low-cost eDRAM applications", STMicroelectronics, 2005 Symposium on VLSI Technology Digest of Technical Papers, 2 pages.

S. Okhonin et al., "New Generation of Z-RAM", Innovative Silicon, IEEE 2007, 4 pages.

* cited by examiner

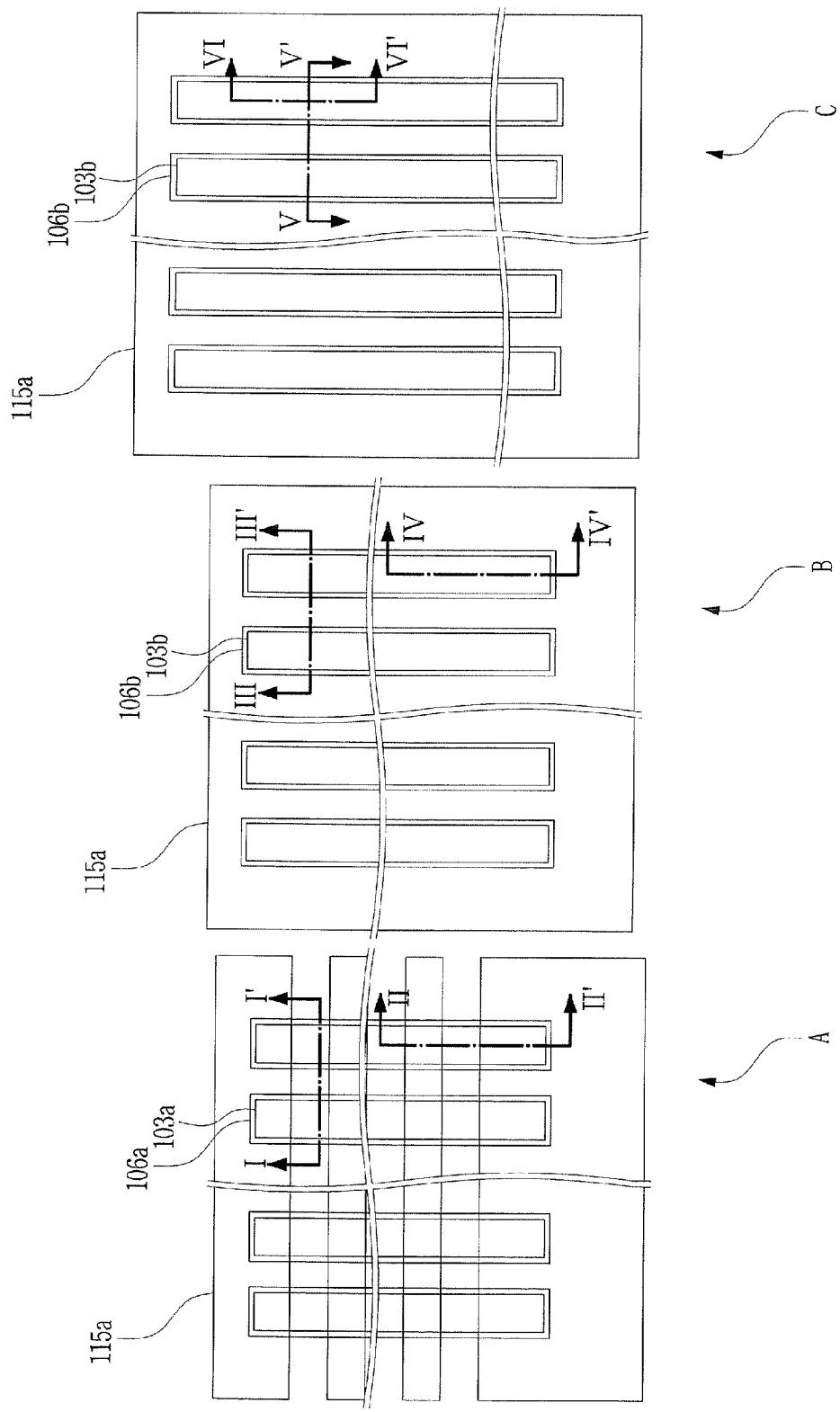

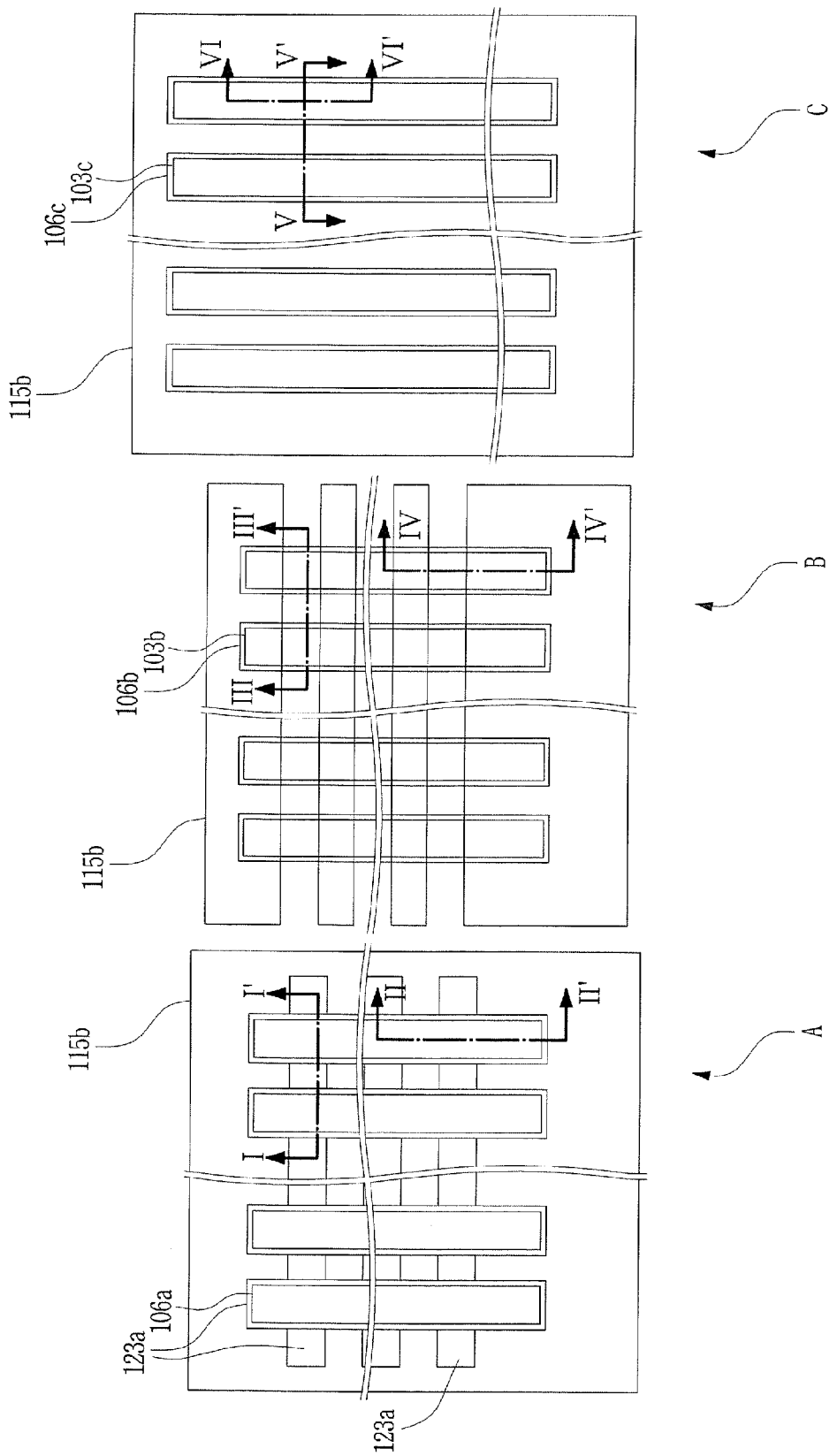

SEMICONDUCTOR DEVICE HAVING FLOATING BODY ELEMENT AND BULK BODY ELEMENT

CROSS-REFERENCE TO RELATED APPLICATION

This application claims the benefit of Korean Patent Application No. 10-2007-0064532, filed on Jun. 28, 2007, the contents of which are hereby incorporated herein by reference in their entirety.

FIELD OF THE INVENTION

The present invention relates to a semiconductor device and a method of manufacturing the same, and more particularly, to a semiconductor device having a floating body element and a bulk body element and a manufacturing method thereof.

BACKGROUND

Currently, research into transistors having a Silicon On Insulator (SOI) structure is actively progressing. The SOI structure includes a lower semiconductor substrate, an upper silicon pattern and a buried insulating layer interposed between the lower semiconductor substrate and the upper silicon pattern to insulate them from each other. Transistors having the SOI structure can realize high-speed operation and reduced power consumption. However, the transistors having the SOI structure may have difficulty in controlling threshold voltage.

Meanwhile, an SOI Metal Oxide Semiconductor Field-Effect Transistor (MOSFET) employing a back gate to control threshold voltage of transistors having the SOI structure is discussed in, for example, U.S. Pat. No. 6,664,598 B1 entitled "Polysilicon Back-Gated SOI MOSFET for Dynamic Threshold Voltage Control" to Dennard et al.

SUMMARY

An embodiment of the invention provides a semiconductor device having a bulk body element and a floating body element.

Another embodiment of the invention provides a method of manufacturing a semiconductor device having a bulk body element and a floating body element.

In one aspect, the present invention is directed to a semiconductor device having a floating body element and a bulk body element. The semiconductor device comprises a substrate having a bulk body element region and floating body element regions. An isolation region defining an active region of the bulk body element region of the substrate and defining first buried patterns and first active patterns, which are sequentially stacked on a first element region of the floating body element regions of the substrate is provided. A first buried dielectric layer interposed between the first buried patterns and the substrate and between the first buried patterns and the first active patterns is provided.

In some embodiments of the present invention, the first active patterns may be self-aligned on the first buried patterns.

In other embodiments of the present invention, at least one first connection that connects the first buried patterns to each other may be further comprised.

The first connection may be disposed at the same level as the first buried patterns. Alternatively, the first connection may be spaced apart from sidewalls of the first active patterns by the thickness of the first buried dielectric layer to cover them.

In still other embodiments of the present invention, the first buried patterns may be formed of an n-type doped semiconductor layer, a p-type doped semiconductor layer, an undoped semiconductor layer or a metal layer.

In yet other embodiments of the present invention, the plurality of first active patterns may be disposed on each of the first buried patterns.

First lower gate contact structures electrically connected to each of the first buried patterns.

In yet other embodiments of the present invention, second buried patterns and second active patterns, which are sequentially stacked on a second element region of the floating body element regions of the substrate and defined by the isolation region; a second buried dielectric layer interposed between the second buried patterns and the substrate and between the second buried patterns and the second active patterns; and at least one second connection that connects the second buried patterns to each other and is disposed at the same level as the second buried patterns may be further comprised.

The second active patterns may have a different thickness from the first active patterns.

The second buried patterns may have a different thickness from the first buried patterns.

The second buried patterns may be formed of a material layer having different characteristics from the first buried patterns.

A second lower gate contact structure electrically connected to the second buried patterns.

In yet other embodiments of the present invention, third buried patterns and third active patterns, which are sequentially stacked on a third element region of the floating body element regions of the substrate and are defined by the isolation region; at least one third connection that connects the third buried patterns to each other and covers sidewalls of the third active patterns; and a third buried dielectric layer interposed between the third buried patterns and the substrate, between the third buried patterns and the third active patterns, between the third connection and the substrate, and between the third connection and the third active patterns may be further comprised.

In yet other embodiments of the present invention, a passivation layer on the substrate and an integrated circuit substrate on the passivation layer may be further comprised.

In another aspect, the present invention is also directed to a semiconductor device having a floating body element. The semiconductor device comprises buried patterns on a substrate. At least one connection extending from the buried patterns and connecting the buried patterns to each other is provided. Active patterns are provided on the buried patterns. A buried dielectric layer interposed between the buried patterns and the substrate, between the buried patterns and the active patterns, between the connection and the substrate and between the connection and the active patterns is provided. At least one gate structure is provided on the active patterns.

In some embodiments of the present invention, the connection may be disposed at the same level as the buried patterns or cover sidewalls of the active patterns.

In other embodiments of the present invention, the buried patterns may be self-aligned with the active patterns.

In still other embodiments of the present invention, the plurality of active patterns may be provided on each of the buried patterns.

In yet other embodiments of the present invention, the active patterns may have different thicknesses from each other.

In yet other embodiments of the present invention, the buried patterns may have different thicknesses from each other.

In yet other embodiments of the present invention, the gate structure may cover sidewalls of the active patterns.

In yet other embodiments of the present invention, a lower gate contact structure electrically connected to the buried patterns may be further comprised.

In still another aspect, the present invention is also directed to a method of manufacturing a semiconductor device having a bulk body element and a floating body element. The method comprises preparing a substrate having a bulk body element region and floating body element regions. An isolation region defining an active region of the bulk body element region of the substrate and defining first sacrificial patterns and first active patterns, which are sequentially stacked on a first element region of the floating body element regions of the substrate is formed. A first recessed region partially exposing the first sacrificial patterns is formed in the isolation region using a photolithography and etching process. The first sacrificial patterns are removed to form first empty spaces below the first active patterns. A first buried dielectric layer is formed on an inner wall of the first empty space and an inner wall of the first recessed region. First buried patterns filling at least the first empty spaces are formed on the substrate having the first buried dielectric layer.

In some embodiments of the present invention, while the isolation region is formed, defining second sacrificial patterns and second active patterns, which are sequentially stacked on a second element region of the floating body element regions of the substrate; forming a second recessed region partially exposing the second sacrificial patterns in the isolation region; removing the second sacrificial patterns to form second empty spaces below the second active patterns; forming a second buried dielectric layer on an inner wall of the second empty space and an inner wall of the second recessed region; forming second buried patterns filling the second empty space.

The second active patterns may have a different thickness from the first active patterns.

In yet another aspect, the present invention is also directed to a method of manufacturing a semiconductor device having a floating body element. The method comprises forming a sacrificial layer and an active layer, which are sequentially stacked, on a substrate. The sacrificial layer and the active layer are patterned to form sacrificial patterns and active patterns, which are sequentially stacked. An isolation region surrounding the sacrificial patterns and the active patterns, which are sequentially stacked, is formed. A recessed region is formed in the isolation region to partially expose a sidewall of each of the sacrificial patterns. The sacrificial patterns are selectively removed to form empty spaces below the active patterns. A buried dielectric layer may be formed on an inner wall of the empty spaces and an inner wall of the recessed region. A buried layer filling the empty spaces and the recessed region is formed on the substrate having the buried dielectric layer. The dielectric layer is partially etched to form buried patterns remaining in the empty spaces and a connection remaining in the recessed region to connect the buried patterns to each other. Also, at least one gate structure is formed on the active patterns.

In some embodiments of the present invention, the active patterns may have different thickness from each other.

In yet another aspect, the present invention is directed to a method of manufacturing a semiconductor device having a plate-shaped back gate. The method comprises forming a sacrificial layer and an active layer, which are sequentially stacked, on a substrate. The sacrificial layer and the active layer are patterned to form sacrificial patterns and preliminary active patterns, which are sequentially stacked. An isolation region surrounding the sacrificial patterns and the preliminary active patterns, which are sequentially stacked, is formed. A recessed region is formed in the isolation region to partially expose a sidewall of each of the sacrificial patterns. The sacrificial pattern is selectively removed to form empty spaces below the preliminary active patterns. A buried dielectric layer is formed on inner walls of the empty spaces and an inner wall of the recessed region. Buried patterns filling the empty spaces and the recessed region are formed on the substrate having the buried dielectric layer. The preliminary active patterns are patterned to form a plurality of active patterns on each of the buried patterns. At least one gate structure is formed on the active patterns.

BRIEF DESCRIPTION OF THE DRAWINGS

FIGS. 1A to 1H are plan views of a semiconductor device according to an exemplary embodiment of the present invention.

Figure 1A:
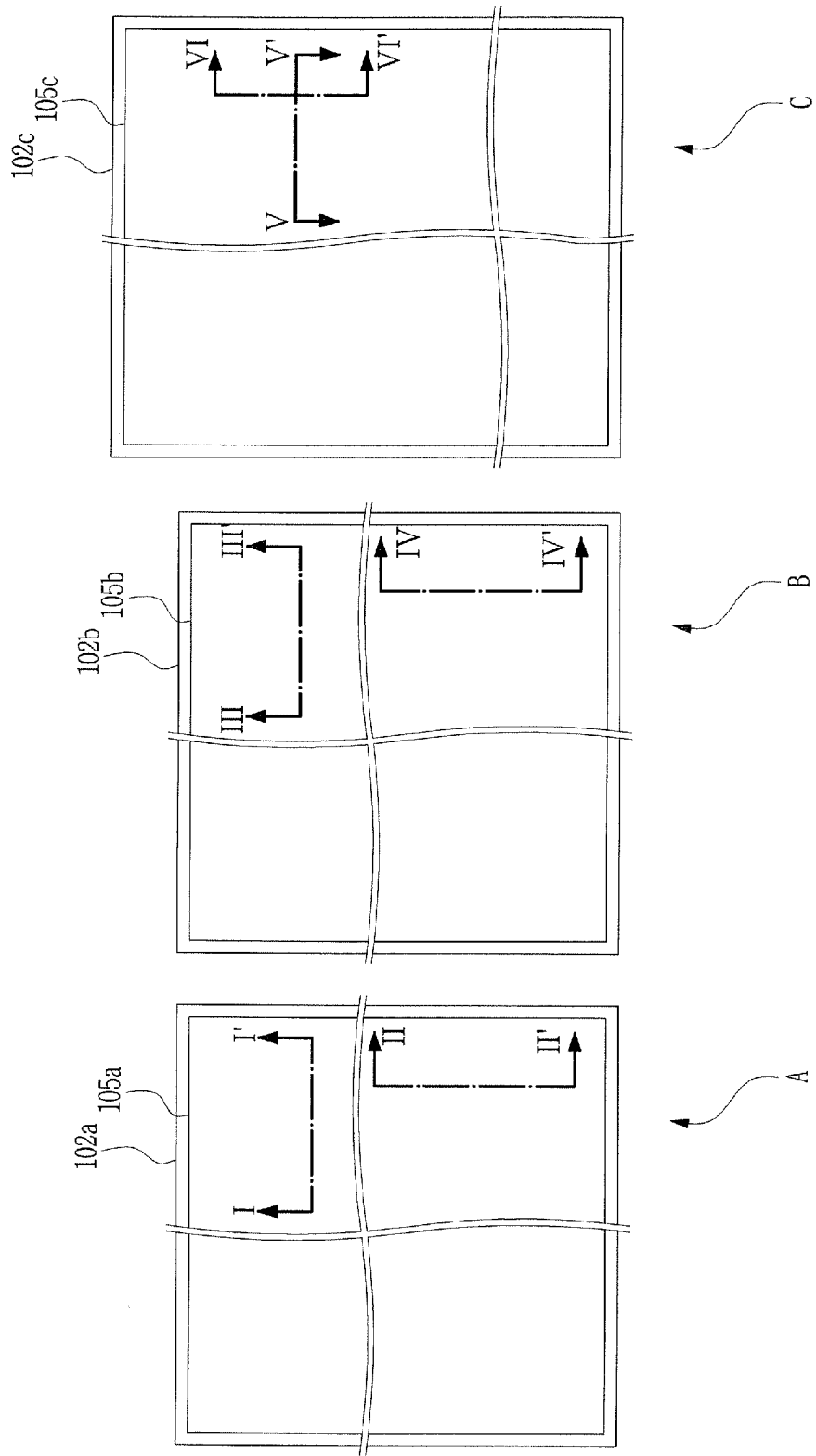
Figure 1B:
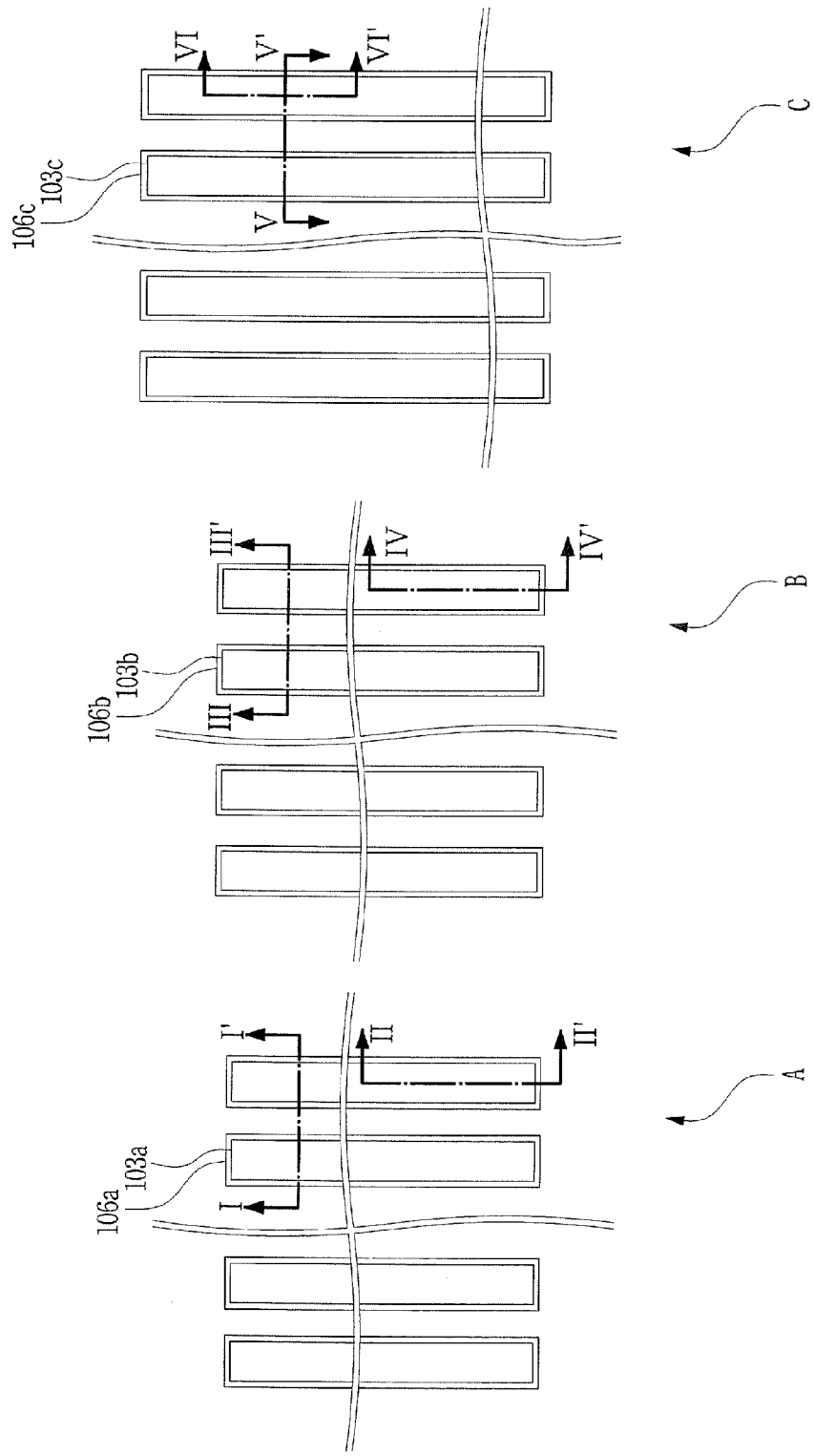
Figure 1E:
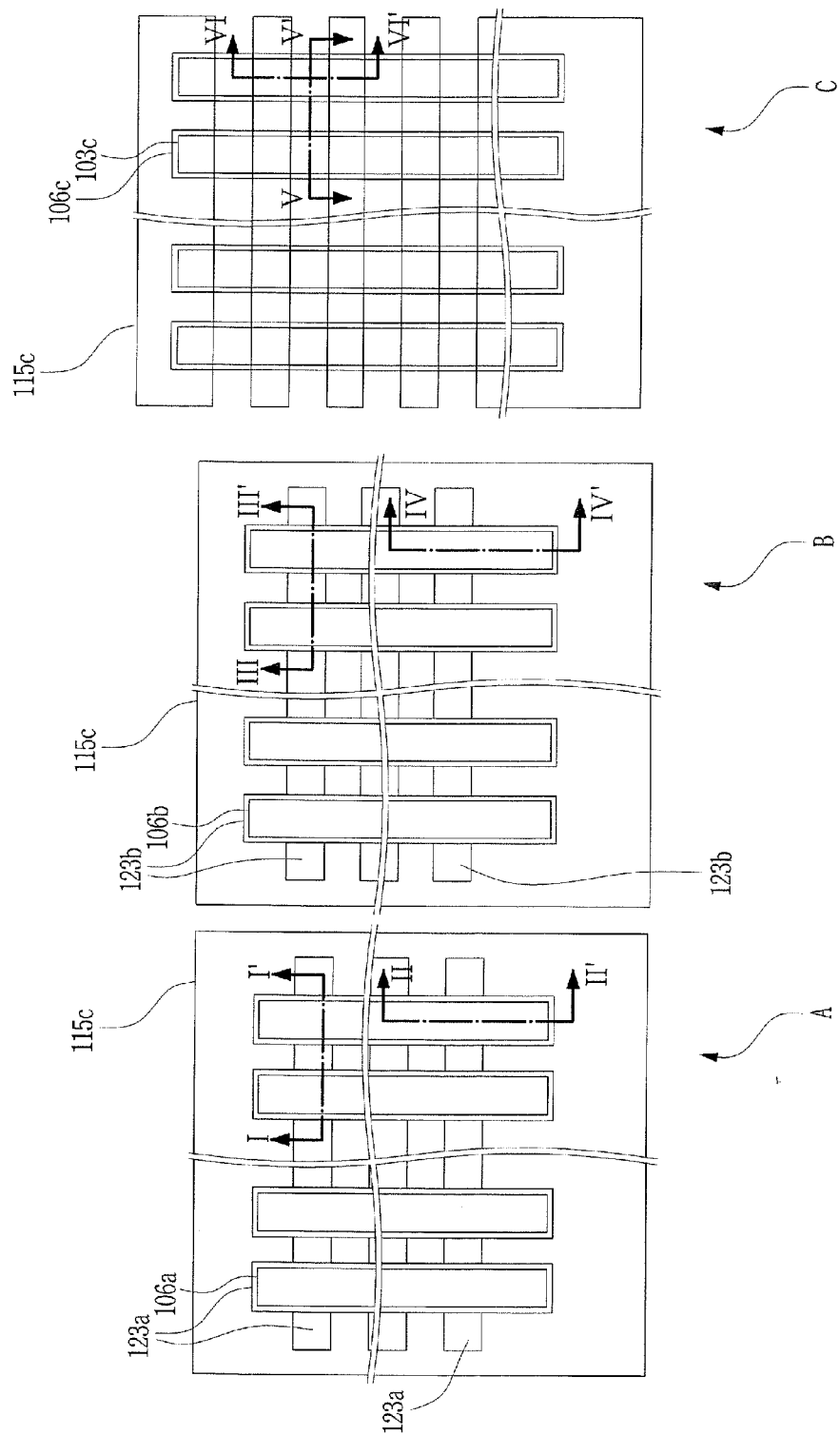
Figure 1F:
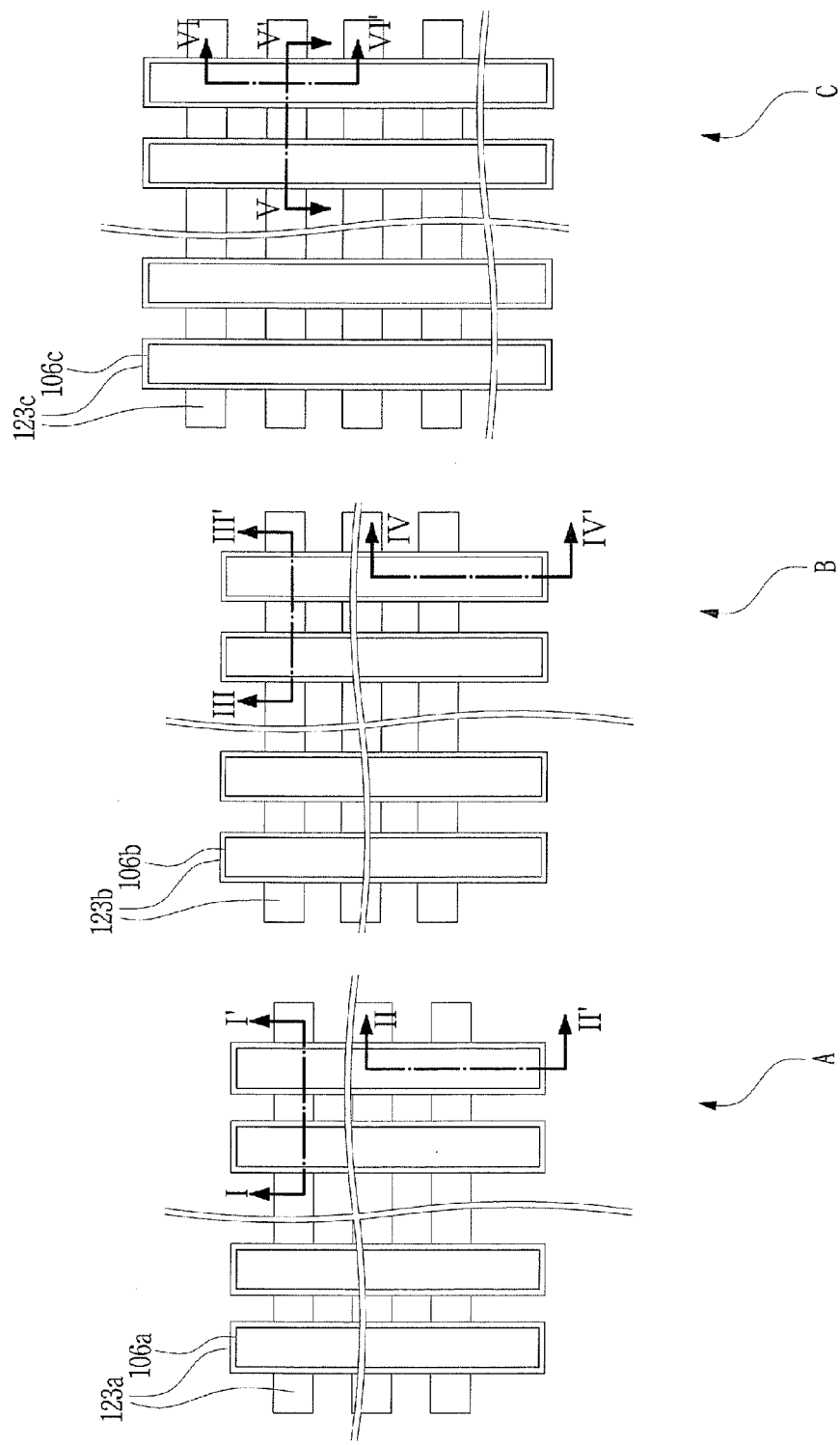

DESCRIPTION OF EMBODIMENTS
ACCORDING TO THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Figure 11A:
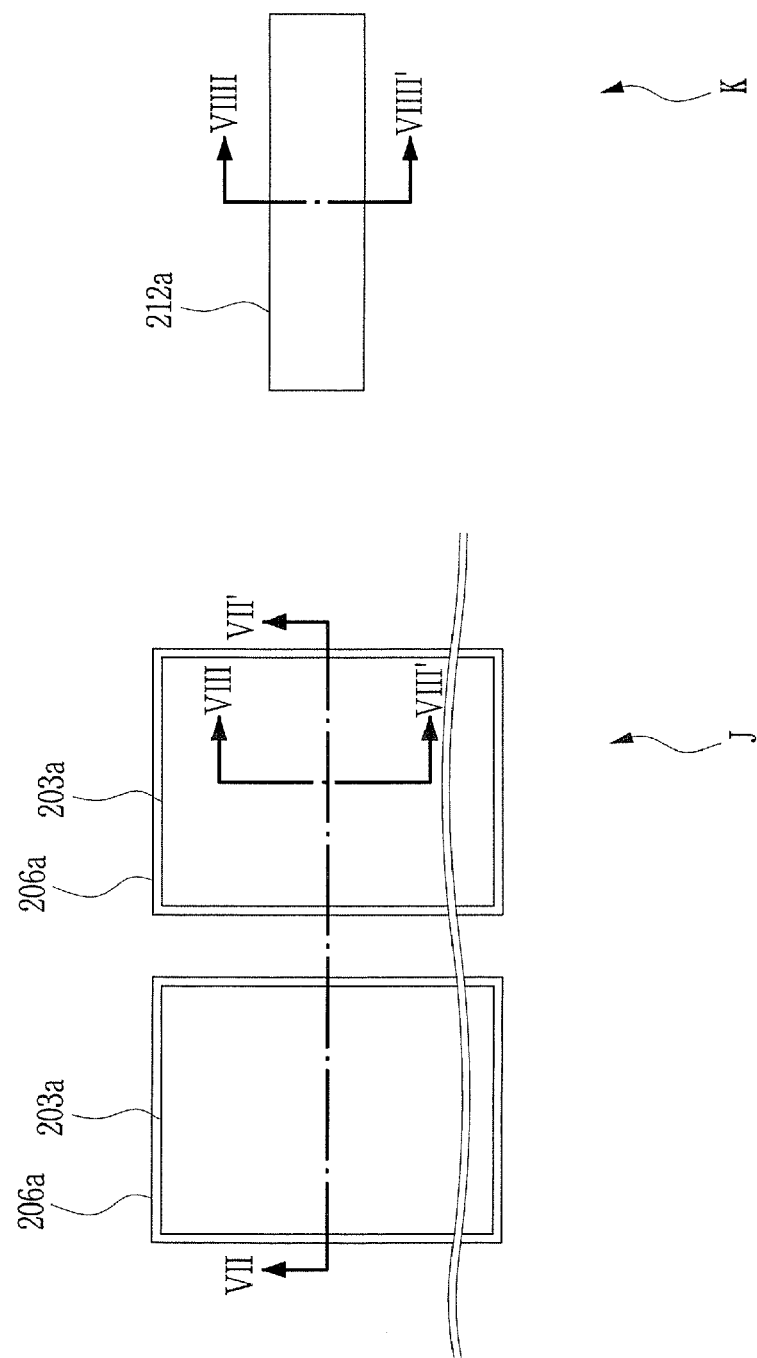
FIGS. 11A to 11E are plan views of a semiconductor device according to another exemplary embodiment of the present invention.
Figure 11B:
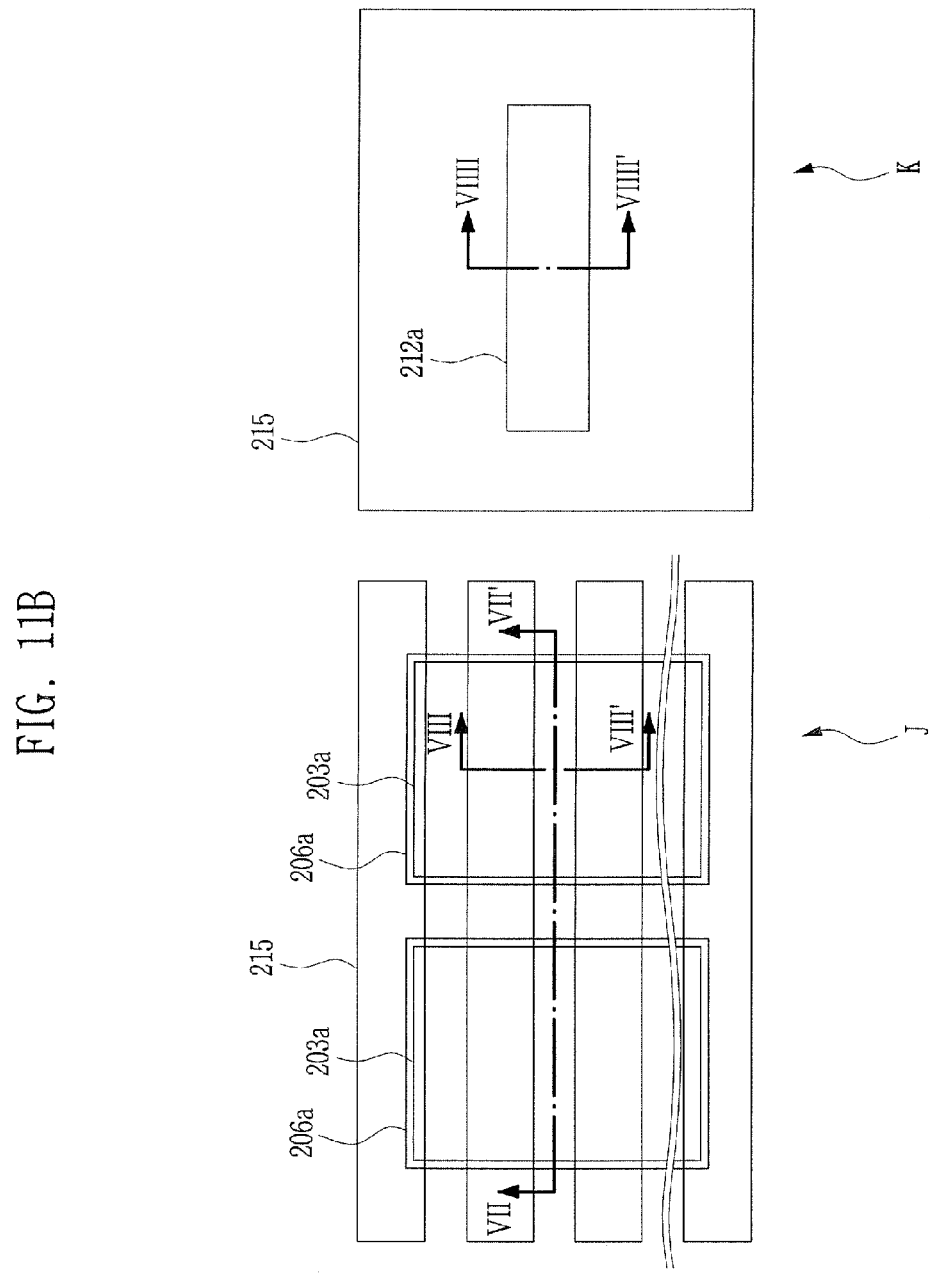
Figure 11C:
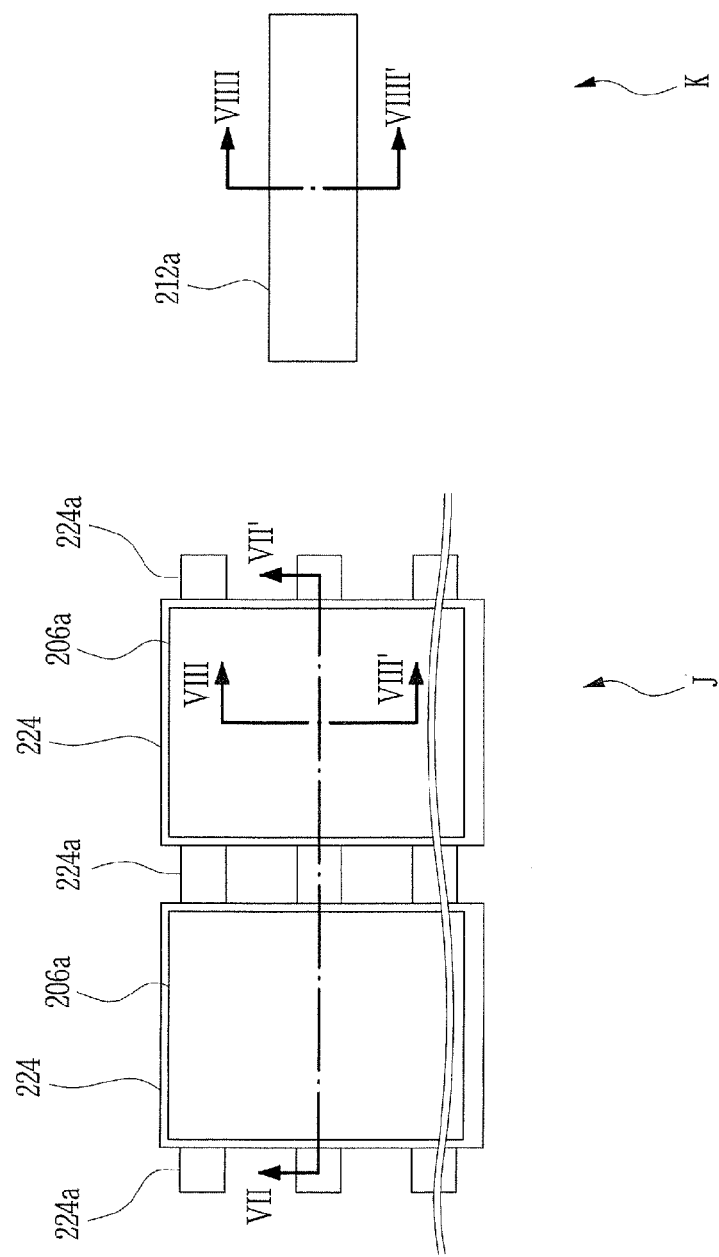
Figure 11D:
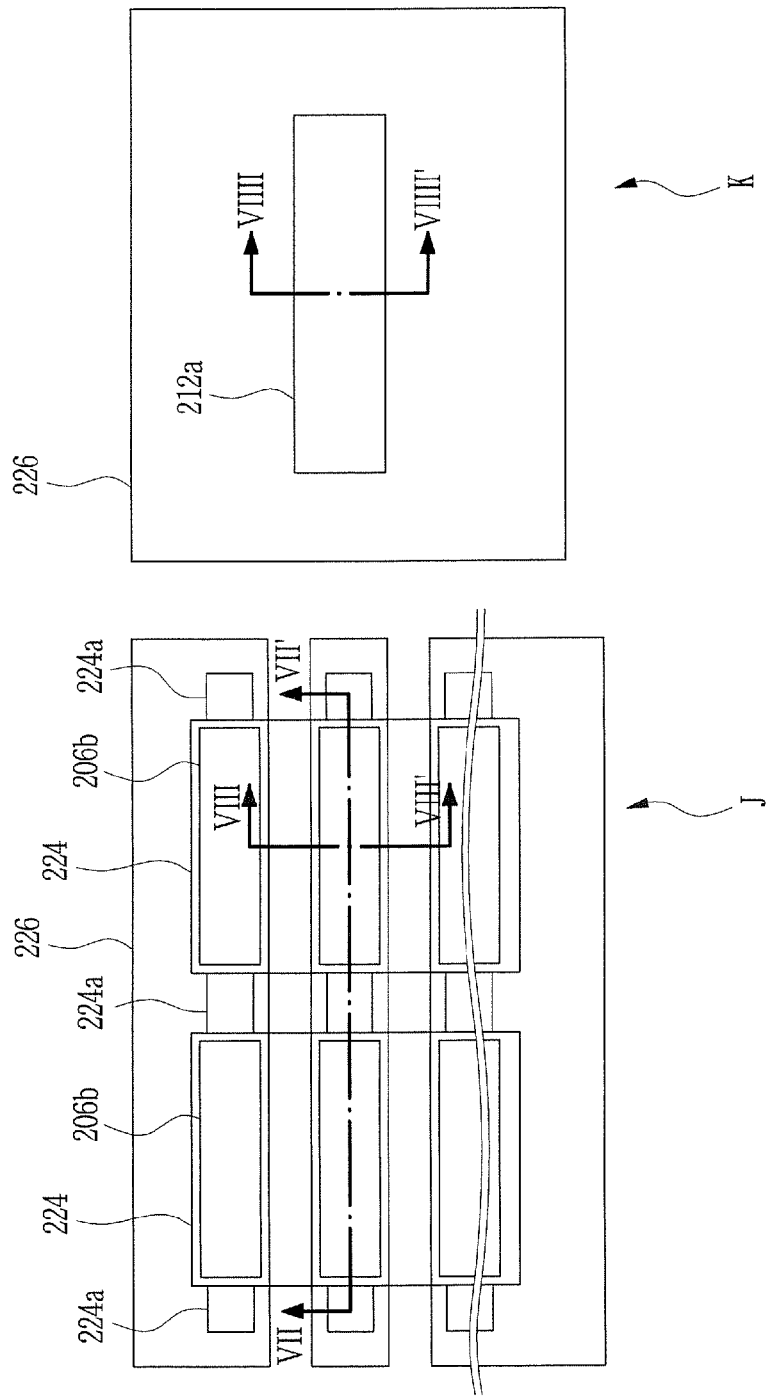
Figure 12A:
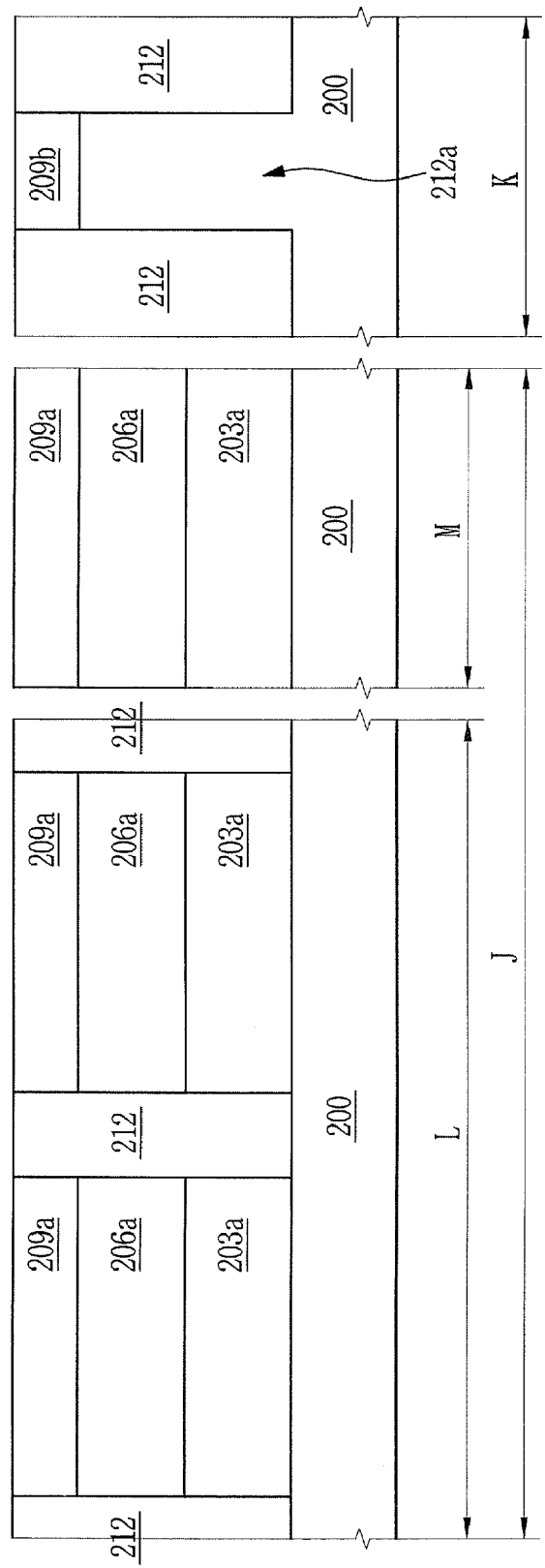
FIGS. 12A to 12E are cross-sectional views of a semiconductor device according to another exemplary embodiment of the present invention.
Figure 12B:
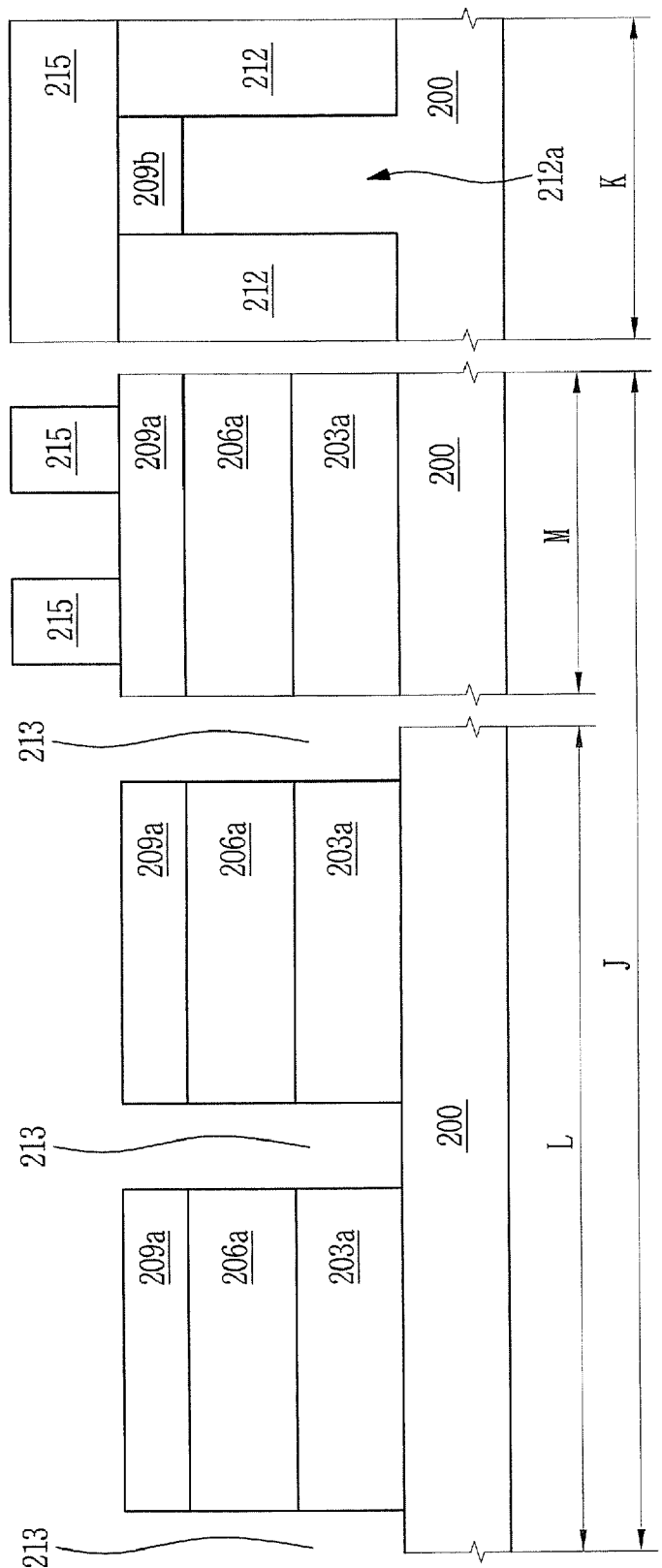
Figure 12C:
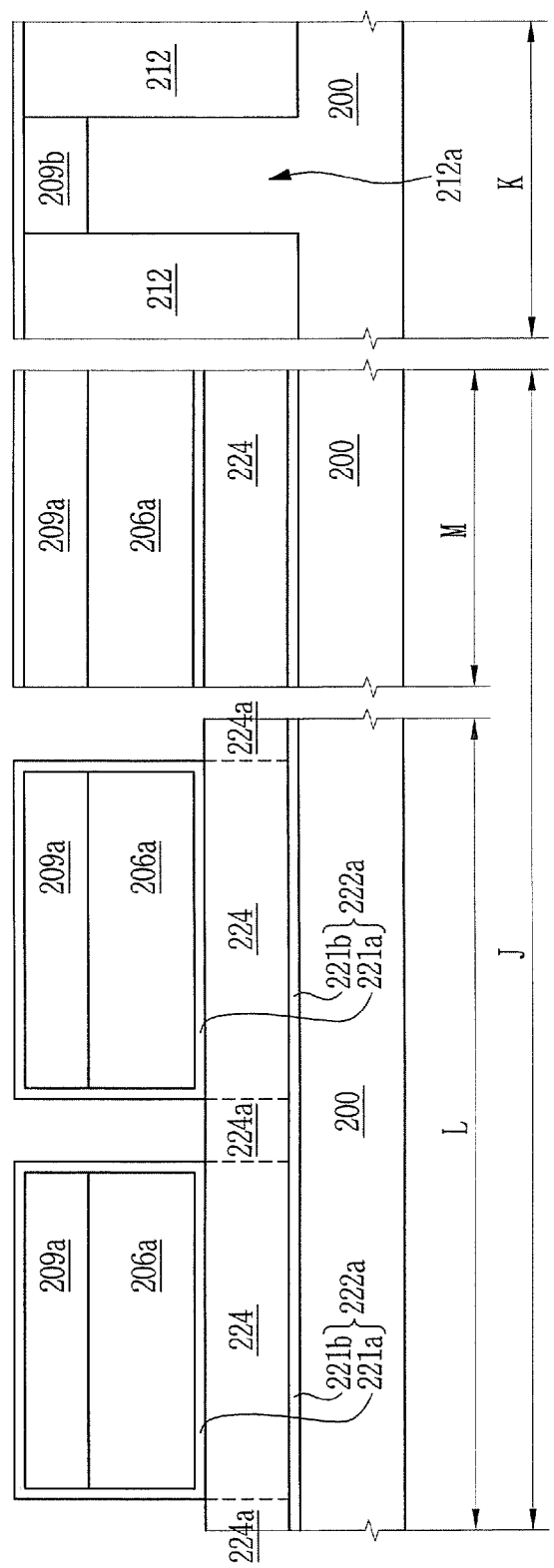
Figure 12D:
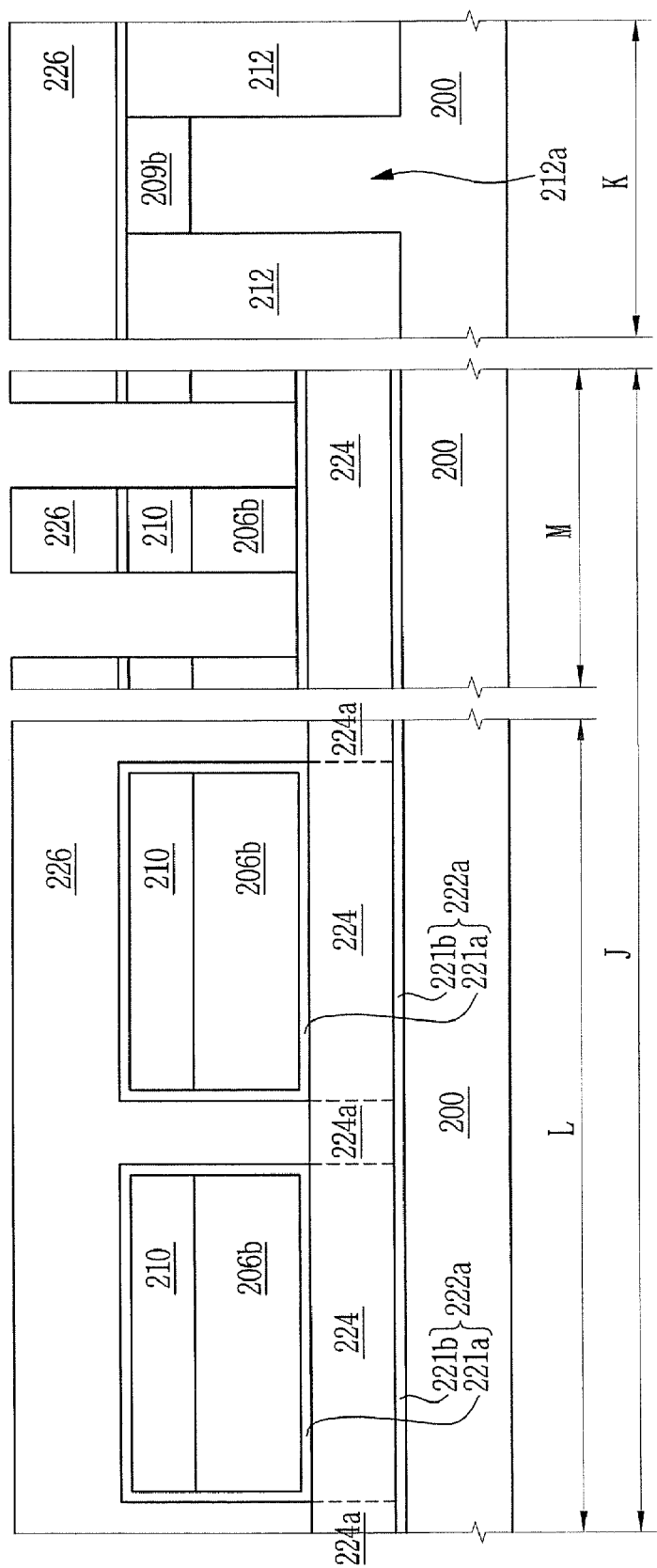
Figure 13:
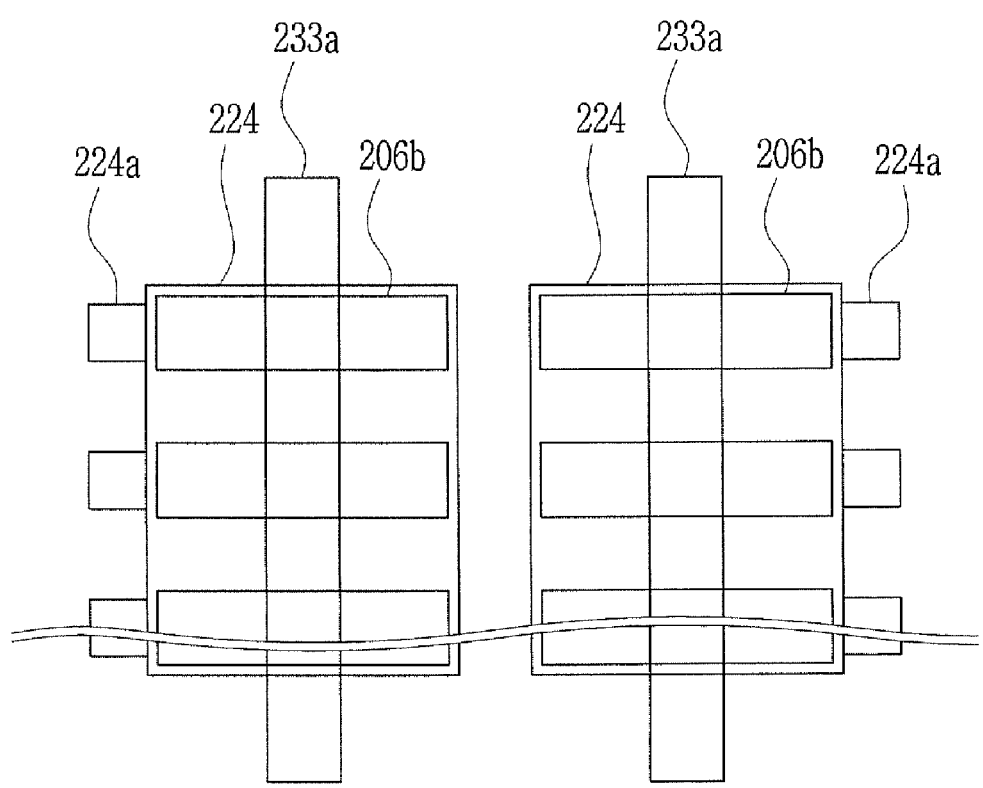
FIG. 13 is a plan view of a semiconductor device according to still another exemplary embodiment of the present invention.
Figure 14:
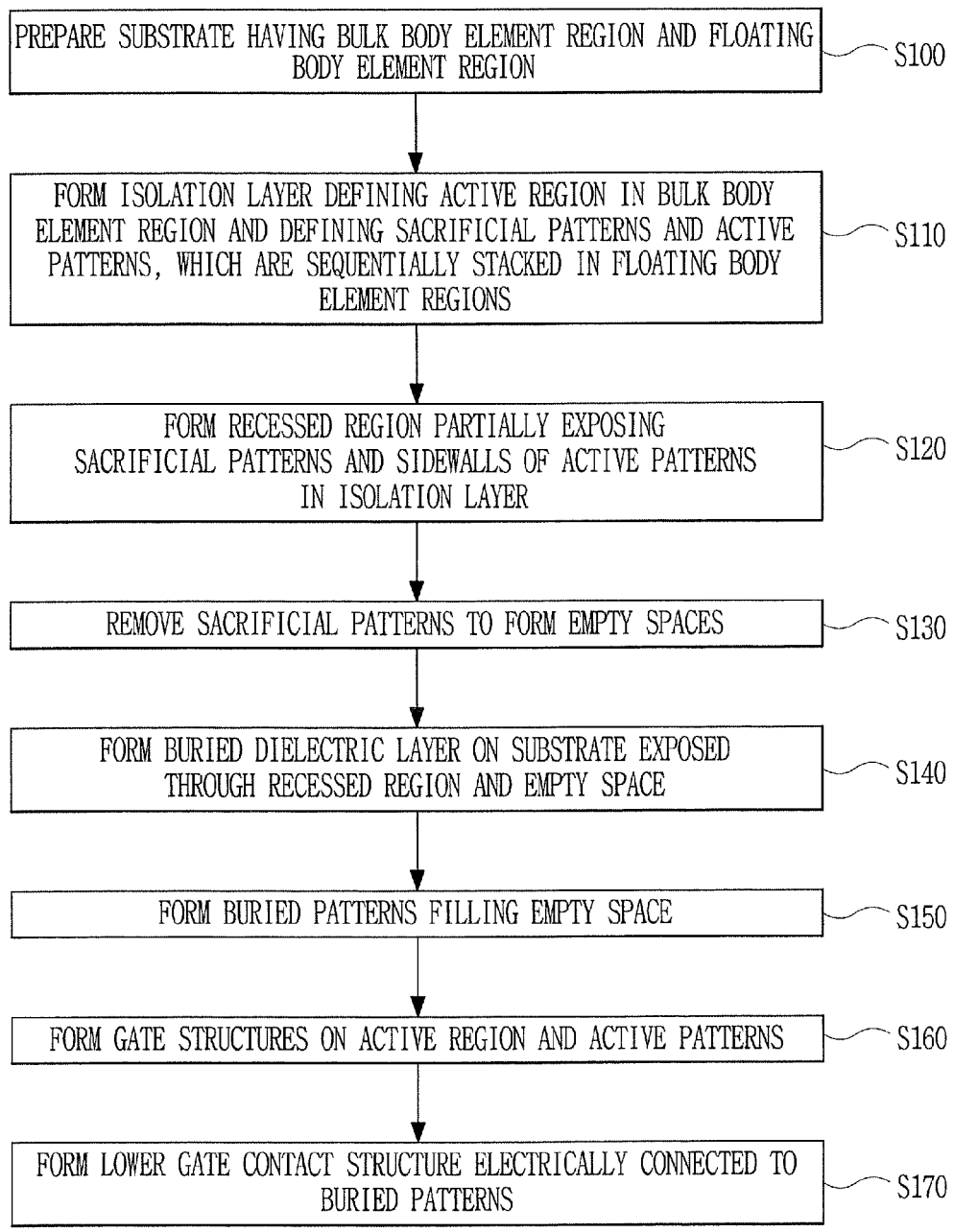
FIG. 14 is a flowchart schematically illustrating a method of manufacturing a semiconductor device according to an exemplary embodiment of the present invention.
Figure 15:
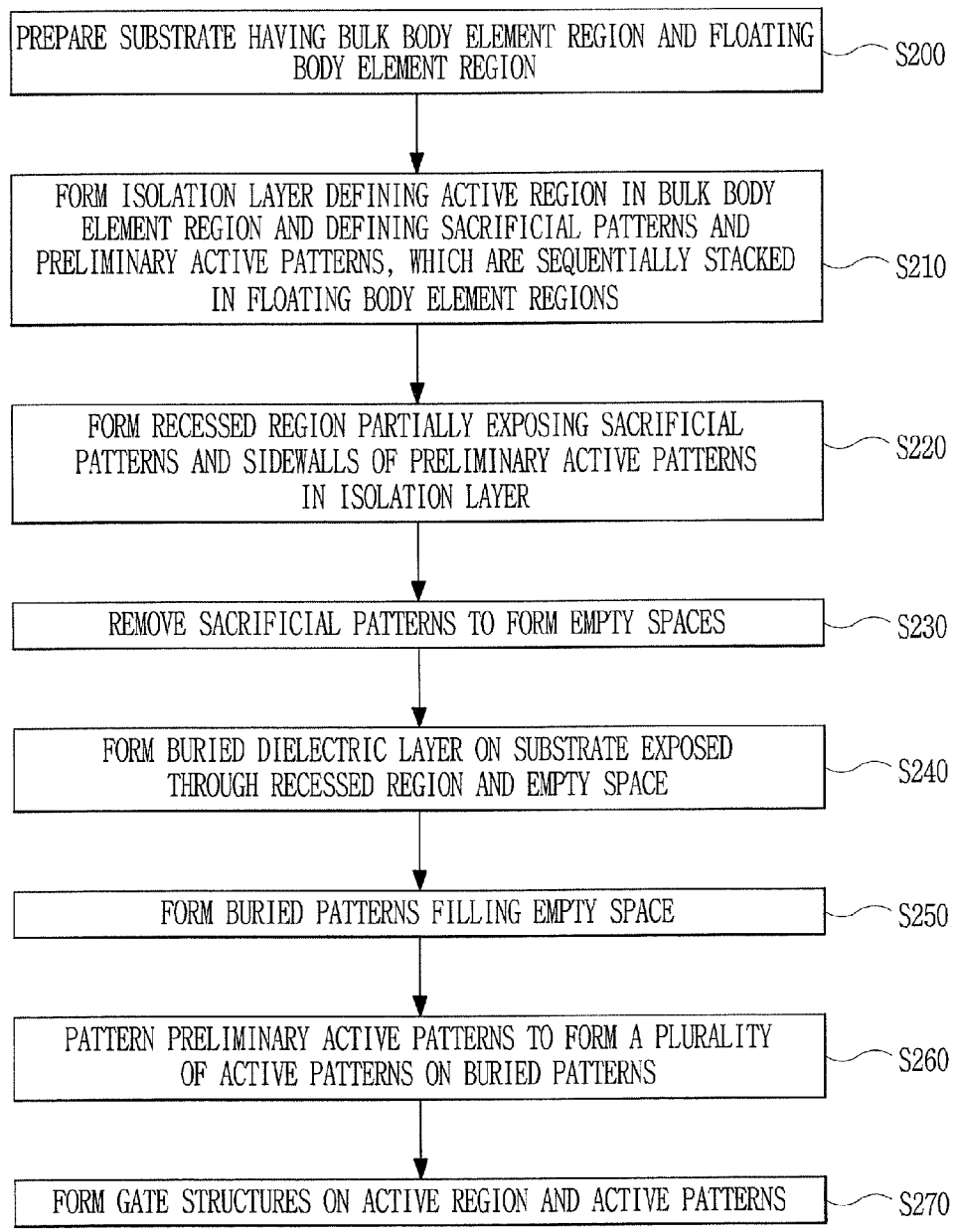
FIG. 15 is a flowchart schematically illustrating a method of manufacturing a semiconductor device according to another exemplary embodiment of the present invention.
Figure 16:
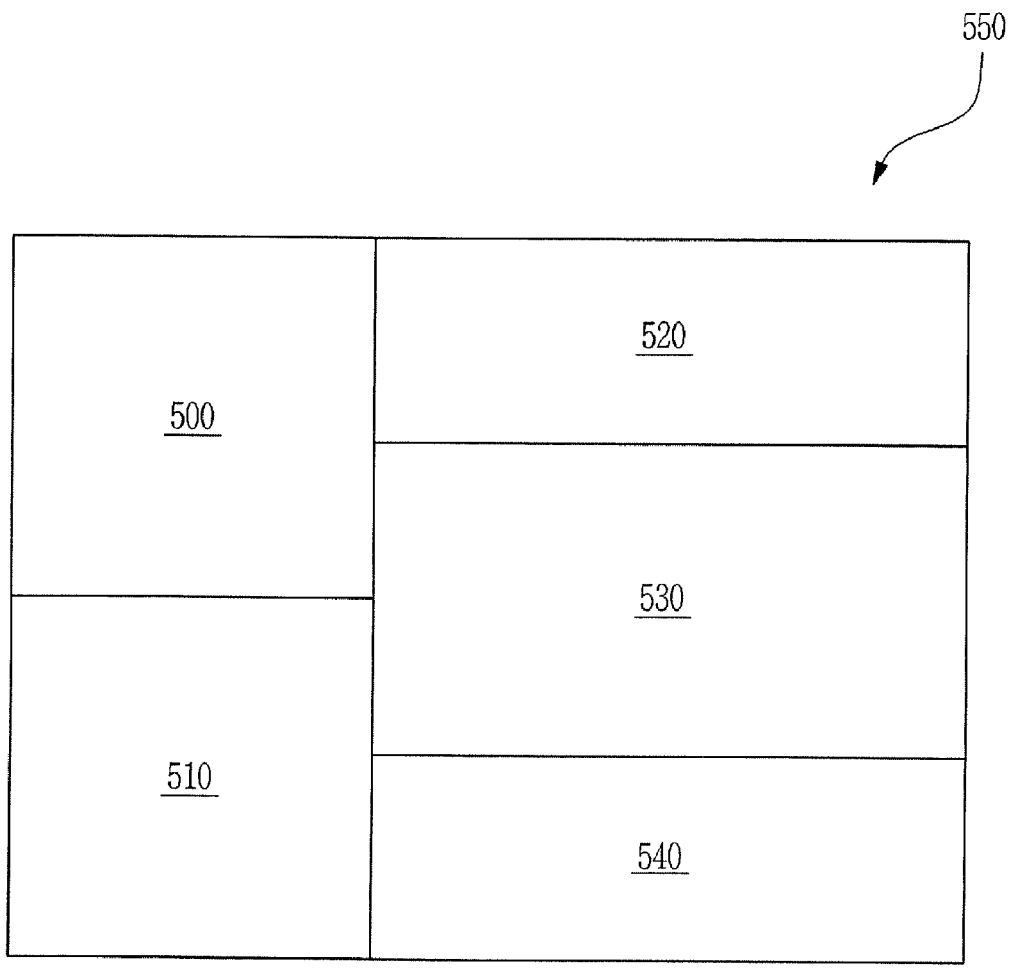
FIG. 16 is a plan view of a semiconductor device manufactured according to exemplary embodiments of the present invention.
Figure 17:
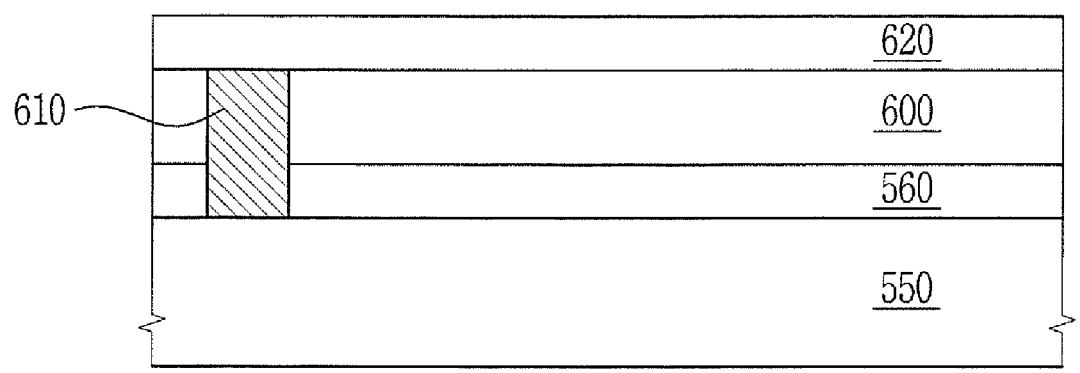
FIG. 17 is a cross-sectional view of a semiconductor device manufactured according to other exemplary embodiments of the present invention.

FIGS. 1A to 1H are plan views of a semiconductor device according to an exemplary embodiment of the present invention, and FIGS. 2A to 2C, 3A to 3C, 4A to 4C, 5A to 5C, 6A to 6C, 7A to 7C, 8A to 8C, 9A to 9C, and 10A to 10C are cross-sectional views of a semiconductor device according to an exemplary embodiment of the present invention. FIGS. 11A to 11E are plan views of a semiconductor device according to another exemplary embodiment of the present invention, FIGS. 12A to 12E are cross-sectional views of a semiconductor device according to another exemplary embodiment of the present invention, FIG. 13 is a plan view of a semiconductor device according to a still another exemplary embodiment of the present invention, FIG. 14 schematically illustrates a method of manufacturing a semiconductor device according to an exemplary embodiment of the present invention, FIG. 15 schematically illustrates a method of manufacturing a semiconductor device according to another exemplary embodiment of the present invention, FIG. 16 is a plan view of a semiconductor device manufactured according to exemplary embodiments, and FIG. 17 is a cross-sectional view of a semiconductor device manufactured according to other exemplary embodiments of the present invention.

In FIGS. 1A to 1H, 2A to 2C, 3A to 3C, 4A to 4C, 5A to 5C, 6A to 6C, 7A to 7C, 8A to 8C, 9A to 9C, and 10A to 10C, reference mark "A" represents a first element region, reference mark "B" represents a second element region, and reference mark "C" represents a third element region. In FIGS. 2A, 3A, 4A, 5A, 6A, 7A, 8A, 9A, and 10A, reference mark "D" represents a region taken along line I-I' of FIGS. 1A to 1H, and reference mark "E" represents a region taken along line II-II' of FIGS. 1A to 1H. In FIGS. 2B, 3B, 4B, 5B, 6B, 7B, 8B, 9B, and 10B, reference mark "F" represents a region taken along line III-III' of FIGS. 1A to 1H, and reference mark "G" represents a region taken along line IV-IV' of FIGS. 1A to 1H. In FIGS. 2C, 3C, 4C, 5C, 6C, 7C, 8C, 9C, and 10C, reference mark "H" represents a region taken along line V-V' of FIGS. 1A to 1H, and reference mark "I" represents a region taken along line VI-VI' of FIGS. 1A to 1H.

In FIGS. 11A to 11E and 12A to 12E, reference mark "J" represents a floating body element region, and reference mark "K" represents a bulk element region. Also, in FIGS. 12A to 12E, reference mark "L" represents a region taken along line VII-VII' of FIGS. 11A to 11E, and reference mark "M" represents a region taken along line VIII-VIII' of FIGS. 11A to 11E. Further, in FIGS. 12A to 12E, reference mark "K" represents a bulk element region taken along line VIIII-VIIII' of FIGS. 1A to 11E.

A structure of a semiconductor device according to an exemplary embodiment of the present invention will be described with reference to FIGS. 1H, 10A, 10B and 10C.

Referring to FIGS. 1H, 10A, 10B and 10C, a substrate 100 including a plurality of device element regions may be provided. The substrate 100 may be a silicon substrate. The substrate 100 may have bulk body element regions and floating body element regions. The substrate 100 may have a first element region A of the floating body element regions, a second element region B of the floating body element regions and a third element region C of the floating body element regions. The first element region A may be a first memory cell array region, the second element region B may be a second memory cell array region, and the third element region C may be a third memory cell array region. However, they should not be construed as limited to the embodiments set forth herein. For example, a part of the first to third element regions A, B and C may be integrated circuit regions including Field Effect Transistor (FET) regions.

An isolation region 112 defining first buried patterns 124*a* and first active patterns 106*a*, which are sequentially stacked on the first element region A of the substrate 100, second buried patterns 124*b* and second active patterns 106*b*, which are sequentially stacked on the second element region B of the substrate 100, third buried patterns 124*c* and third active patterns 106*c*, which are sequentially stacked on the third element region C of the substrate 100 and the active region of the bulk body element region may be provided. The isolation region 112 may be an insulating layer such as a silicon oxide layer.

The first buried patterns 124*a* may be an n-type doped semiconductor layer, a p-type doped semiconductor layer, an undoped semiconductor layer or a metal layer. The semiconductor layer may be a silicon layer, and the metal layer may be a titanium nitride (TiN) layer or a tantalum nitride (TaN) layer. The second buried patterns 124*b* may be formed of an n-type doped semiconductor layer, a p-type doped semiconductor layer, an undoped silicon layer or a metal layer. The third buried patterns 124*c* may be formed of an n-type doped semiconductor layer, a p-type doped semiconductor layer, an undoped silicon layer or a metal layer.

The first to third buried patterns 124a, 124b and 124c may have the same thickness. Alternatively, at least one of the first to third buried patterns 124a, 124b and 124c may have a different thickness.

The first to third buried patterns 124a, 124b and 124c may be formed of the same material. Alternatively, at least one of the first to third buried patterns 124a, 124b and 124c may be formed of a different material.

The first to third active patterns 106a, 106b and 106c may be formed of a semiconductor layer. For example, the first to third active patterns 106a, 106b and 106c may be formed of a single crystalline silicon layer. The first to third active patterns 106a, 106b and 106c may have the same thickness. Also, the first to third active patterns 106a, 106b and 106c may have different thicknesses from each other.

In the first element region A, the first active pattern 106a may be self-aligned on the first buried patterns 124a. Also, the first buried patterns 124a may be spaced apart from each other to be electrically separated. The first buried patterns 124a may be a back gate electrode of a element such as a transistor that is provided in the first element region A. Accordingly, an individual electric signal may be applied to each of the first buried patterns 124a. Meanwhile, when the first buried patterns 124a are formed of an undoped silicon layer, the first buried patterns 124a may serve as dielectrics.

The first buried dielectric layer 122a may include a first lower buried dielectric layer 121a interposed between the first buried patterns 124a and the substrate 100. Also, a first upper buried dielectric layer 121b interposed between first active patterns 106a and the first buried patterns 124a may be provided. Here, the first lower buried dielectric layer 121a and the first upper buried dielectric layer 121b may constitute the first buried dielectric layer 122a. The first buried dielectric layer 122a may be a silicon oxide layer or a high-k dielectric layer having a higher dielectric constant than the silicon oxide layer.

In another embodiment, the first buried dielectric layer 122a may include an data storage layer. The data storage layer may be a charge trap layer of a flash memory device. For example, the first buried dielectric layer 122a may be an Oxide-Nitride-Oxide (ONO) layer including a first oxide layer, a nitride layer as a charge trap layer and a second oxide layer. Meanwhile, a nano-crystal material may be used for the data storage layer.

In the second element region B, at least one first connection 125b that electrically connects the second buried patterns 124b to each other may be provided. Therefore, the second buried patterns 124b may be electrically connected to each other by the first connection 125b to be used as a common back gate electrode of a element that is provided in the second element region B. Thus, the first connection 125b may extend from the second buried patterns 124b to be formed of the same material as the second buried patterns 124b. In addition, the first connection 125b may be substantially disposed at the same level as the second buried patterns 124b. Meanwhile, when the second buried patterns 124b are formed of an undoped silicon layer, the second buried patterns 124b may act as dielectrics.

A second lower buried dielectric layer 121c that is interposed between the second buried patterns 124b and the substrate 100 and between the first connection 125b and the substrate 100 may be provided. A second upper buried dielectric layer 121d that is interposed between the second active patterns 106b and the second buried patterns 124b may be provided. The second lower buried dielectric layer 121c and the second upper buried dielectric layer 121d may constitute a second buried dielectric layer 122b. The second buried dielectric layer 122b may be a silicon oxide layer or a high-k dielectric layer having a higher dielectric constant than the silicon oxide layer.

In still another embodiment, the second buried dielectric layer 122b may include an data storage layer. The data storage layer may be a charge trap layer of a flash memory device.

In the third element region C, at least one second connection 125c that electrically connects the third buried patterns 124c to each other may be provided. Thus, the second connection 125c may extend from the third buried patterns 124c to be formed of the same material as the third buried patterns 124c. In addition, the second connection 125c may cover sidewalls of the third active patterns 106c. Therefore, the third buried patterns 124c may be electrically connected to each other by the second connection 125c to be used as a common back gate electrode that is provided in the third element region C. Here, since bottoms and sidewalls of the third active patterns 106c are covered by the third buried patterns 124c and the second connection 125c, a threshold voltage of a transistor formed in the third element region C may be controlled by the common back gate electrode of the third element region. Meanwhile, when the third buried patterns 124c are formed of an undoped silicon layer, the third buried patterns 124c may act as dielectrics.

A third lower buried dielectric layer 121e that is interposed between the third buried patterns 124c and the substrate 100 and between the second connection 125c and the substrate 100 may be provided. A third upper buried dielectric layer 121f that is interposed between the third active patterns 106c and the third buried patterns 124c and between the third active patterns 106c and the second connection 125c may be provided. The third lower and upper buried dielectric layers 121e and 121f may constitute a third buried dielectric layer 122c. The third buried dielectric layer 122c may be a silicon oxide layer or a high-k dielectric layer.

In yet another embodiment, the third buried dielectric layer 122c may include an data storage layer. The data storage layer may be a charge trap layer of a flash memory device.

In the first element region A, the first buried patterns 124a may be electrically separated from each other. Thus, an individual electric signal may be applied to each of the first buried patterns 124a. Moreover, the second buried patterns 124b in the second element region B may be connected to each other by the first connection 125b. Similarly, the third buried patterns 124c in the third element region C may be electrically connected to each other.

As described above, elements that perform various functions may be formed on the substrate having the first to third buried patterns 124a, 124b and 124c, the first to third active patterns 106a, 106b and 106c and the first to third buried dielectric layers 122a, 122b and 122c in the first to third element regions A, B, and C. That is, elements with various structures may be provided in the first to third element regions A, B and C. Furthermore, various elements may be formed in a semiconductor chip by combining with a element formed in the bulk element region.

A gate structure and an interconnection structure, which constitute a non-volatile memory cell array region in the first element region A, and a gate structure and an interconnection structure, which constitute a first volatile memory cell array region in the second element region B, and a gate structure and an interconnection structure, which constitute a second volatile memory cell array region in the third element region C, will be described below.

In the first element region A, first gate structures 136a may be provided on the first active patterns 106a. The plurality of first gate structures 136a may be provided on the first active patterns 106a. The gate structures 136a may be spaced apart from each other to be formed in an island shape on the first active patterns 106a. Each of the first gate structures 136a may include a first gate dielectric layer 130a and a first gate electrode 133a, which are sequentially stacked. The first gate dielectric layer 130a may include an data storage layer. The data storage layer may be a charge trap layer of a flash memory device.

Meanwhile, the first gate dielectric layer 130a may be formed of the same material as the first buried dielectric layer 122a. For example, when the first buried dielectric layer 122a includes an data storage layer, and the first gate dielectric layer 130a is formed of the same material as the first buried dielectric layer 122a, the first element region A may be used as a cell region of a flash memory device having a multi-bit storage node. Furthermore, when the first gate dielectric layer 130a and the first buried dielectric layer 122a are formed of the same material and have the same thickness, programming/erasing/reading of a flash memory cell may be performed by the same operating voltage.

Meanwhile, the first gate structure 136a may be a cell gate structure of a flash memory device including a gate dielectric layer, a floating gate, an intergate dielectric layer and a control gate electrode, which are sequentially stacked.

In the second element region B, at least one second gate structure 136b may be provided on the second active patterns 106b. The second gate structures 136b may cover sidewalls of the second active patterns 106b. The second gate structure 136b may include a second gate dielectric layer 130b and a second gate electrode 133b, which are sequentially stacked. The second gate electrode 133b may be formed in a line shape with an orientation to cross the second active patterns 106b. The second gate dielectric layer 130b may be a silicon oxide layer or a high-k dielectric layer having a higher dielectric constant than the silicon oxide layer. The second gate electrode 133b may be formed of a conductive layer.

In the third element region C, at least one third gate structure 136c may be provided on the third active regions 106c. The third gate structure 136c may include a third gate dielectric layer 130c and a third gate electrode 133c, which are sequentially stacked. The third gate electrode 133c may be formed in a line shape with an orientation to cross the third active patterns 106c. The third gate electrode 133c may provide a word line of a memory device. The third gate dielectric layer 130c may be formed of a silicon oxide layer or a high-k dielectric layer having a higher dielectric constant than the silicon oxide layer. The third gate electrode 133c may be formed of a conductive layer.

First source and drain regions 145a may be provided in the first active patterns 106a at both sides of the first gate structures 136a. Second source and drain regions 145b may be provided in the second active patterns 106b at both sides of the second gate structures 136b. Third source and drain regions 145c may be provided in the third active patterns 106c at both sides of the first gate structures 136c. A lower interlayer insulating layer 147 and an upper interlayer insulating layer 151, which are sequentially stacked, may be provided on the substrate having the first to third gate structures 136a, 136b and 136c.

In the first element region A, first lower conductive patterns 148 passing through the lower interlayer insulating layer 147, crossing the first active patterns 106a and electrically connected to the first source and drain regions 145a may be provided. The first lower conductive patterns 148 may provide a bit line of a memory device. The plurality of first gate structures 136a may be provided in an island shape on the first active patterns 106a. Therefore, each of the first gate structures 136a may be interposed between the first lower conductive patterns 148.

First upper conductive patterns 157a may be provided on the upper interlayer insulating layer 147. Each of the first upper conductive patterns 157a may be formed in a line shape with an orientation to cross the first lower conductive patterns 148, and may overlap the first gate structures 136a. The upper conductive patterns 157a may provide a word line of a memory device. First gate contact structures 154a may be provided between the first upper conductive patterns 157a and the first gate structures 136a.

First lower gate contact structures 155a sequentially passing through the upper interlayer insulating layer 151 and the lower interlayer insulating layer 147 and electrically connected to each of the first buried patterns 124a may be provided. First lower gate interconnections 157b respectively covering the first lower gate contact structures 155a may be provided on the upper interlayer insulating layer 151. Therefore, in the first element region A, an interconnection structure of the above-mentioned non-volatile memory device may be provided on the substrate having the first buried patterns 124a and the first active patterns 106a.

In the second element region B, line shaped second lower conductive patterns 149a passing through the lower interlayer insulating layer 147, electrically connected to one of the second source and drain regions 145b, and crossing the second active patterns 106b may be provided. Also, island-shaped second lower contact structures 149b passing through the lower interlayer insulating layer 147 and electrically connected to the other of the second source and drain regions 145b may be provided. The second lower conductive patterns 149a and the second lower contact structures 149b may be formed of the same material.

Second upper contact structures 154b passing through the upper interlayer insulating layer 151 and electrically connected to the second lower contact structures 149b may be provided. Line-shaped second upper conductive patterns 158a covering the second upper contact structures 154b and formed with an orientation to cross the second gate electrodes 133b may be provided on the upper interlayer insulating layer 151.

Second lower gate contact structures 155b sequentially passing through the upper interlayer insulating layer 151 and the lower interlayer insulating layer 147 and electrically connected to each of the second buried patterns 124b may be provided. A second lower gate interconnection 158b covering the lower gate contact structure 155b may be provided on the upper interlayer insulating layer 151.

In the third element region C, third lower conductive patterns 150a passing through the lower interlayer insulating layer 147, electrically connected to one of the second source and drain regions 145c, and crossing the third active patterns 106c may be provided. Also, island-shaped third lower contact structures 150b passing through the lower interlayer insulating layer 147 and electrically connected to the other one of the third source and drain regions 145c may be provided. The third lower conductive patterns 150a and third lower contact structures 150b may be formed of the same material. The third lower conductive patterns 150a may provide a common source line (CSL).

Third upper contact structures 154c passing through the upper interlayer insulating layer 151, and electrically connected to the third lower contact structures 150b may be provided. Line-shaped third upper conductive patterns 159a covering the third upper contact structures 154c and formed with an orientation to cross the third gate electrodes 133c may be provided on the upper interlayer insulating layer 151. Therefore, the third upper conductive patterns 159a may provide a bit line of a memory device.

Meanwhile, the third active patterns 106c interposed between the third source and drain regions 145c and disposed below the third gate structure 136c may provide a data storage region of a memory device. Accordingly, a memory device such as a floating body DRAM may be provided. Also, sidewalls and bottoms of the third active patterns 106c may be covered by the third buried patterns 124c and the third connections 125c. As a result, since the third connection 125c electrically connects the third buried patterns 124c to each other, a threshold voltage of a element formed in the third element region C may be easily controlled by the third buried patterns 124c acting as a back gate electrode. A third lower gate contact structure 155c sequentially passing through the upper interlayer insulating layer 151 and the lower interlayer insulating layer 147 and electrically connected to each of the third buried patterns 124c may be provided. A third lower gate interconnection 159b covering the third lower gate contact structure 155c may be provided on the upper interlayer insulating layer 151.

As described above, cell gate and interconnection structures of a non-volatile memory device may be provided on the first active patterns 106a, and cell gate and interconnection structures of a volatile memory device may be provided on the second and third active regions 106b and 106c. This invention may, however, be embodied in different forms and should not be construed as limited to the embodiments set forth herein. For example, in the first element region A, the cell gate and interconnection structures of the second and third element regions B and C may be provided on the first active patterns 106a. Also, the cell gate and interconnection structures of the first element region A may be provided on the second and third active patterns 106b and 106c. Here, the cell gate and interconnection structures of the first element region A may include the first gate structure 136a, the first lower conductive patterns 148 and the first upper conductive patterns 157a. The cell gate and interconnection structures of the second element region B may include the second gate structure 136b, the second lower conductive patterns 149a, the second lower contact structure 149b and the second upper conductive patterns 158a. The cell gate and interconnection structures of the third element region C may include the third gate structure 136c, the third lower conductive patterns 150a, the third lower contact structure 150b and the third upper conductive patterns 159a.

Accordingly, as described above, a semiconductor device such as a system-on-chip having elements with various structures may be provided. For example, as illustrated in FIG. 16, a semiconductor device 550 having a first region 500, a second region 510, a third region 520, a fourth region 530 and a fifth region 540 may be provided. The first to third regions 500, 510 and 520 may be element regions having the second buried patterns 124b and the second connections 125b that connect the second buried patterns 124b to each other. The second buried patterns 124b that are electrically connected to each other, i.e., a semiconductor device formed on a substrate having a second back gate may be provided in the first to third regions 500, 510 and 520. For example, high-performance transistors may be provided in the first region 500, and a cache memory such as an SRAM may be provided in the second region 510. Low power transistors may be provided in the third region 520. A semiconductor device may be provided on a substrate having the third buried patterns 125c and the third connections 125c that electrically connects the third buried patterns 124c to each other and covers the sidewalls of the third active patterns 106c in the fourth region 530. For example, a memory device such as a floating body DRAM may be provided in the fourth region 530. A device formed on a substrate having a back gate electrode such as the first buried patterns 124a may be provided in the fifth region 540. For example, a flash memory device having a multi-bit storage node may be provided in the fifth region 540.

As described above, a semiconductor device having various integrated circuit devices may be provided on the semiconductor device 550. For example, as illustrated in FIG. 17, a semiconductor device that is vertically integrated may be provided. Referring to FIG. 17, a first passivation layer 560 may be provided on the semiconductor device 550. The first passivation layer 560 may be an insulating layer. Another semiconductor device having a semiconductor integrated circuit, i.e., an integrated circuit substrate 600 may be provided on the first passivation layer 560. The integrated circuit substrate 600 may be provided to reduce the planar size of the semiconductor device. For example, an integrated circuit the same as and/or different from the semiconductor device 550 may be provided on the integrated circuit substrate 600. An intersubstrate interconnection 610 that electrically connects the integrated circuit substrate 600 to the semiconductor device 550 may be provided. A second passivation layer 620 that covers the integrated circuit substrate 600 and the intersubstrate interconnection 610 may be provided. One or a plurality of other integrated circuit substrates that are stacked may be provided on the second passivation layer 620. A semiconductor device having various functions may be provided by vertically disposing the semiconductor device 550 and the integrated circuit substrate 600.

Next, the structure of a semiconductor device according to other exemplary embodiments of the present invention will be described with reference to FIGS. 11E and 12E.

Figure 11E:
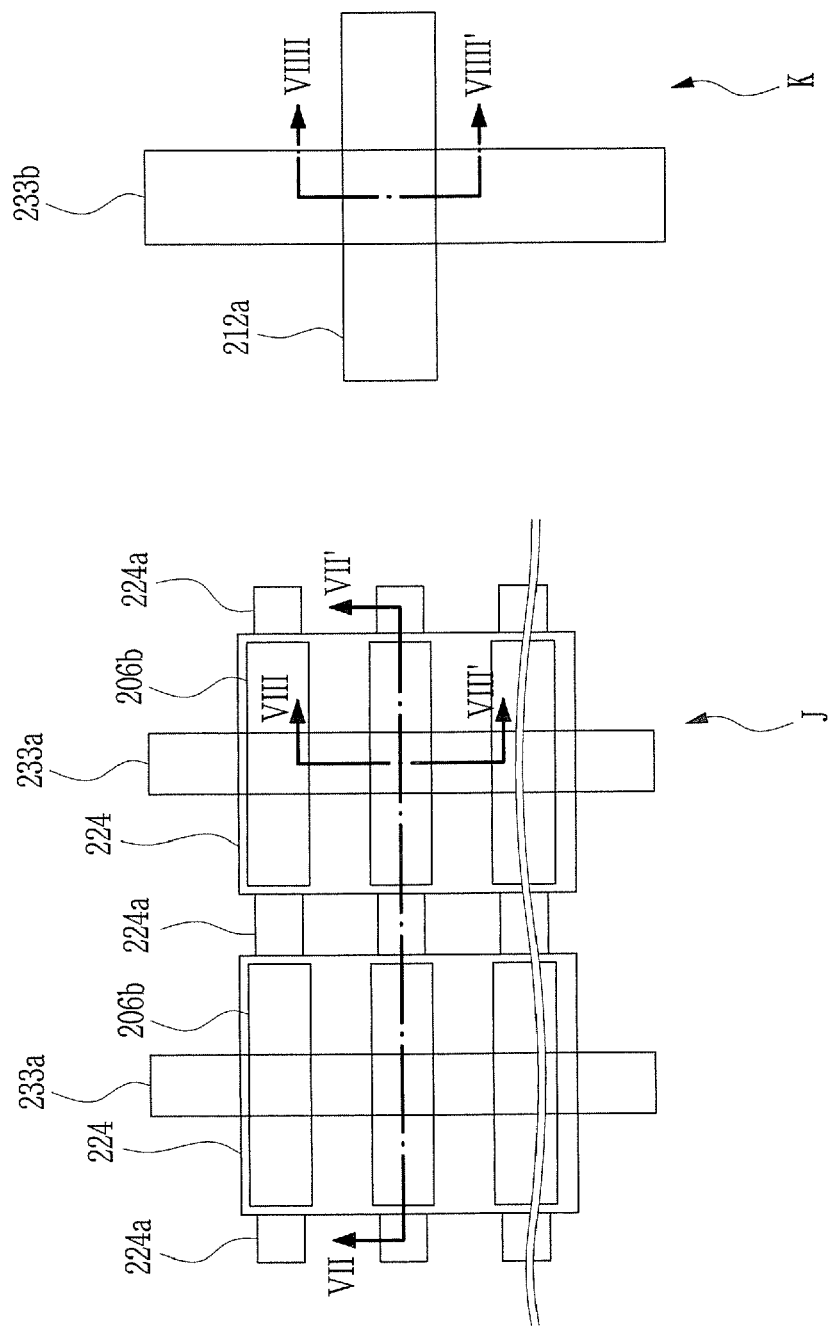
Figure 12E:
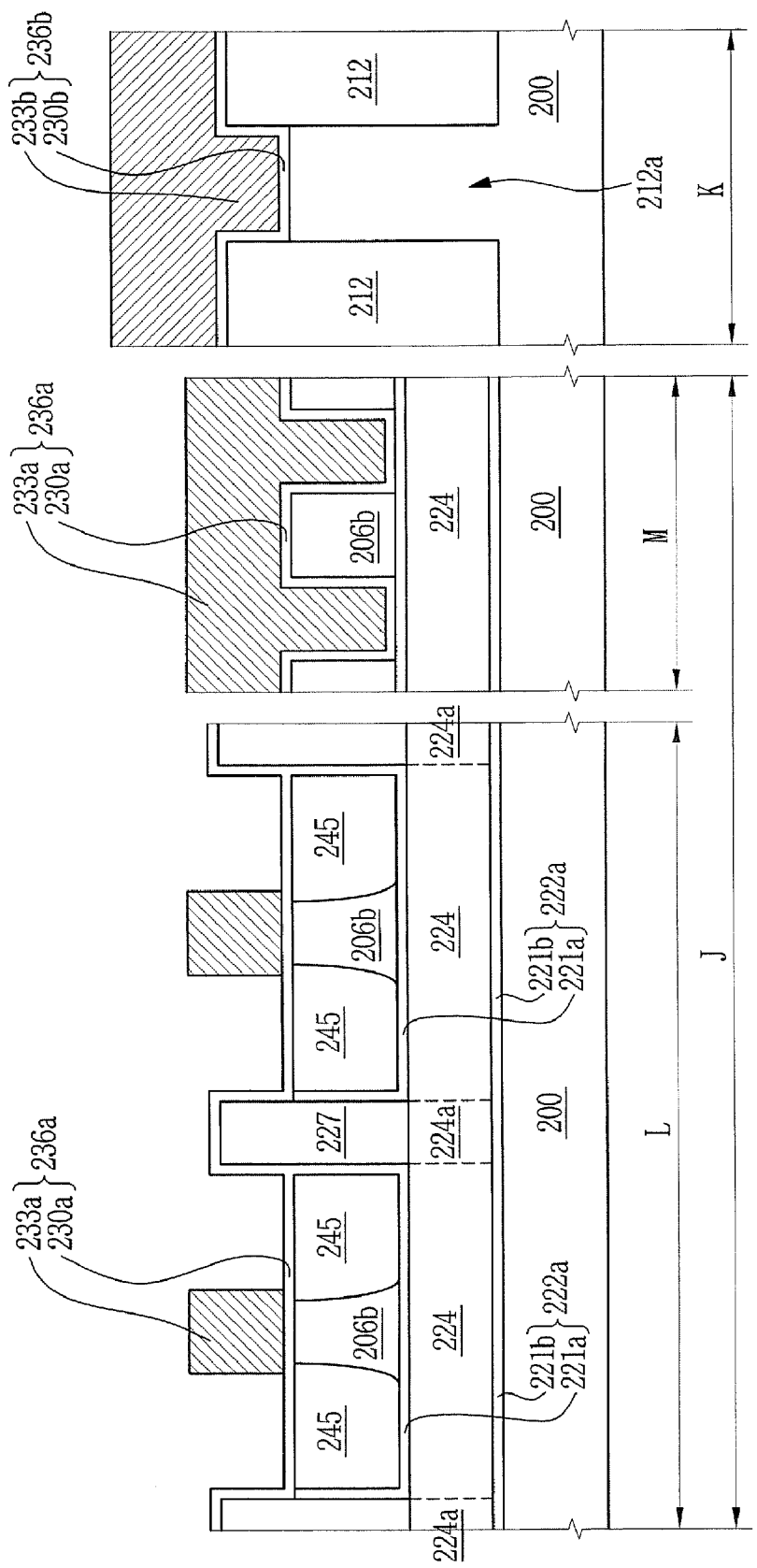

Referring to FIGS. 11E and 12E, a substrate 200 having a plurality of element regions may be provided. For example, the substrate 200 may have a floating body element region J and a bulk body element region K. The substrate 200 may be a semiconductor substrate. For example, the substrate 200 may be a silicon substrate.

In the floating body element region J, buried patterns 224 may be provided on the substrate 200. Also, connections 224a that connect the buried patterns 224 to each other may be provided. As illustrated in FIG. 11E, the connections 224a a may be spaced apart from each other. A plurality of active patterns 206b may be provided on each buried pattern 224. That is, the plurality of active patterns 206b may be provided on one buried pattern 224. A lower buried dielectric layer 221b that is interposed between the buried patterns 224 and the substrate 200 and between the connections 224a and the substrate 200 may be provided. An upper buried dielectric layer 221a may be provided between the buried patterns 224 and the active patterns 206b. The upper and lower buried dielectric layers 221a and 221b may constitute a buried dielectric layer 222a.

First and second isolation regions 212 and 227 that define the buried patterns 224 and the active patterns 206b of the floating body element region J and define an active region 212a of the bulk body element region K may be provided. More specifically, the first isolation region 212 defines the buried patterns 224 of the floating body element region J and the active region 212a of the bulk body element region K. The second isolation region 227 defines the active patterns 206b on the buried patterns 224.

At least one first gate structure 236a crossing the active patterns 206b may be provided. The first gate structure 236a may include a first gate dielectric layer 230a and a first gate electrode 233a, which are sequentially stacked. The first gate structure 236a may cover sidewalls of the active patterns 236b. A second gate structure 236b crossing the active region 212a may be provided. The second gate structure 236b may include a second gate dielectric layer 230b and a second gate electrode 233b, which are sequentially stacked. First source and drain regions 245 may be provided in the first active patterns 206b at both sides of the first gate structures 236a. Second source and drain regions may be provided in the active region 212a at both sides of the second gate structure 236b.

In another exemplary embodiment, as illustrated in FIG. 13, the connections 224a that are disposed between the buried patterns 224 may be omitted. Therefore, the buried patterns 224 may be electrically separated from each other. That is, an individual electric signal may be applied to each of the buried patterns 224. Active patterns that are provided on one of the buried patterns 224 may have a first conductivity type, and active patterns that are provided on the other one of the buried patterns 224 may have a second conductivity type different from the first conductivity type. The first conductivity type may be a p-type, and the second conductivity type may be an n-type. Accordingly, a plurality of NMOS transistors may be provided on one of the buried patterns 224, and a plurality of PMOS transistors may be provided on the other one of the buried patterns 224. The buried patterns 224 may be used as a back gate electrode. Therefore, since the buried patterns 224 may be separated from each other, a first common back gate electrode for controlling a threshold voltage of the NMOS transistors may be provided, and a second common back gate electrode for controlling a threshold voltage of transistors may be provided.

Therefore, a system-on-chip having a bulk body element and a floating body element may be provided. For example, one or two or more elements among elements provided in the first to third element regions A, B and C according to an exemplary embodiment of the present invention, and one or two or more elements among elements provided in the first and second element regions J and K according to another exemplary embodiment of the present invention may be implemented on one chip. Also, all of the above-described devices may be implemented on one chip.

Methods of manufacturing semiconductor devices according to exemplary embodiments of the present invention will be described below.

First, the methods of manufacturing a semiconductor device according to exemplary embodiments of the present invention will be described with reference to FIGS. 1A to 1H, 2A to 2C, 3A to 3C, 4A to 4C, 5A to 5C, 6A to 6C, 7A to 7C, 8A to 8C and 14.

Referring to FIGS. 1A, 2A, 2B, 2C and 14, a substrate 100 having a plurality of element regions is prepared (S100). The substrate 100 may be a semiconductor substrate. For example, the substrate 100 may be a silicon substrate. The substrate 100 may have bulk body element regions and floating body element regions. The substrate 100 may have a first element region A of the floating body element regions, a second element region B of the floating body element regions and a third element region C of the floating body element regions. The first element region A may be a first memory cell array region, the second element region B may be a second memory cell array region and the third element region C may be a third memory cell array region. This invention may, however, should not be construed as limited to the embodiments set forth herein. For example, a part of the first to third element regions A, B and C may be integrated circuit regions including field effect transistor regions.

Meanwhile, while a cross-sectional view and a plan view of the bulk body element region of the substrate 100 are not illustrated, a semiconductor device formed in a bulk body element region will be described below with reference to a processing flowchart of FIG. 15.

A first sacrificial layer 102a and a first active layer 105a, which are sequentially stacked, may be formed on the substrate 100 of the first element region A. The first sacrificial layer 102a and the first active layer 105a may be formed of different material layers from each other. The first sacrificial layer 102a may be formed of a material layer having an etch selectivity with respect to the first active layer 105a. For example, the first sacrificial layer 102a may be formed of silicon germanium (SiGe) using an epitaxial growth technique, and the first active layer 105a may be formed of silicon using an epitaxial growth technique. The first active layer 105a may be formed of single crystalline silicon.

Similarly, a second sacrificial layer 102b and a second active layer 105b, which are sequentially stacked, may be formed on the substrate 100 of the second element region B. Further, a third sacrificial layer 102c and a third active layer 105c, which are sequentially stacked, may be formed on the substrate 100 of the third element region C. The first to third sacrificial layers 102a, 102b and 102c may be formed of a material formed to the same thickness by the same process. The first to third active layers 105a, 105b and 105c may be formed of a material formed to the same thickness by the same process.

In another exemplary embodiment, the first to third sacrificial layers 102a, 102b and 102c may be formed to have different thicknesses from each other. A first sacrificial layer 102a of a first thickness t1 may be formed on the substrate 100 of the first element region A. A second sacrificial layer 102b of a second thickness t2 different from the first thickness t1 may be formed on the substrate 100 of the second element region B. A third sacrificial layer 102c of a third thickness t3 different from the second thickness t2 may be formed on the substrate 100 of the third element region C. For example, after a sacrificial layer is formed on the substrate 100 having the first to third element regions A, B and C, taking into account of characteristics of elements to be formed in the first to third element regions A, B and C, the sacrificial layer may be appropriately etched to form the sacrificial layer 102a to the first thickness t1, to form the second sacrificial layer 102b to the second thickness t2 and to form the third sacrificial layer 102c to the third thickness t3.

In still another exemplary embodiment, the first to third active layers 105a, 105b and 105c may be formed to have different thicknesses from each other. A first active layer 105a of a fourth thickness t4 may be formed on the first sacrificial layer 102a. A second active layer 105b of a fifth thickness t5 different from the fourth thickness t4 may be formed on the second sacrificial layer 102b. A third active layer 105c of a sixth thickness t6 different from the fifth thickness t5 may be formed on the third sacrificial layer 102c. For example, after an active layer is formed on the substrate 100 having the first to third sacrificial layers 102a, 102b and 102c, the first to third active layers 105a, 105b and 105c having different thicknesses from each other may be formed by performing an etching process that partially reduces the thickness of the active layer on at least one of the first to third element regions A, B and C.

In yet another exemplary embodiment, a first sacrificial layer 102a and a first active later 105a may be sequentially formed on the substrate 100 of the first element region A. Here, while the first sacrificial layer 102a and the first active later 105a are sequentially formed, the second and third element regions B and C may be covered by a hard mask. After the first sacrificial layer 102a and the first active layer 105a are formed, the hard mask that covers the second and third element regions B and C may be removed. Similarly, after a second sacrificial layer 102b and a second active layer 105b, which are sequentially formed, are formed in the second element region B, a third sacrificial layer 102c and a third active layer 105c, which are sequentially stacked, may be formed in the third element region C. As described above, the first to third sacrificial layers 102a, 102b and 102c may be formed by different processes from each other, and the first to third active layers 105a, 105b and 105c may be formed by different processes from each other. Therefore, the first to third sacrificial layers 102a, 102b and 102c may be formed to different thicknesses from each other, and the first to third active layers 105a, 105b and 105c may be formed to different thicknesses from each other. Also, the first to third active layers 105a, 105b and 105c may be formed of semiconductors including different elements from each other.

The first to third active layers 105a, 105b and 105c may be formed to have the same conductivity type, i.e., an n-type or a p-type. In contrast, at least one of the first to third active layers 105a, 105b and 105c may be a first conductivity type, and the others may be a second conductivity type different from the first conductivity type. Here, the first conductivity type may be an n-type.

Meanwhile, while the first to third sacrificial layers 102a, 102b and 102c and the first to third active layers 105a, 105b and 105c are formed in the first to third element regions A, B and C, the bulk body element region of the substrate 100 may be protected by a sacrificial mask. The sacrificial mask may be removed after the first to third active layers 105a, 105b and 105c are formed.

Referring to FIGS. 1B, 3A, 3B, 3C and 14, a first hard mask pattern 109a may be formed on the active layer 106a of the first element region A, a second mask pattern 109b may be formed on the active layer 106b of the second element region B, and a third hard mask pattern 109c may be formed on the active layer 106c of the third element region C.

Meanwhile, a fourth mask pattern may be formed on of the bulk element region of the substrate 100.

The first to third hard mask patterns 109a, 109b and 109c may be formed by the same process. The first to third hard mask patterns 109a, 109b and 109c may be formed of a material having an etch selectivity with respect to the first to third active layers 105a, 105b and 105c. For example, when the first to third active layers 105a, 105b and 105c are formed of silicon, the first to third hard mask patterns 109a, 109b and 109c may be formed of a material layer including a silicon nitride layer.

The first to third active layers 105a, 105b and 105c and the first to third sacrificial layers 102a, 102b and 102c may be sequentially etched to form a trench using the first to third hard mask patterns 109a, 109b and 109c as etch masks. As a result, one or a plurality of first sacrificial patterns 103a and first active patterns 106a, which are sequentially stacked, may be formed on the first element region A of the substrate 100, one or a plurality of second sacrificial patterns 103b and second active patterns 106b, which are sequentially stacked, may be formed on the second element region B of the substrate 100, and one or a plurality of third sacrificial patterns 103c and third active patterns 106c, which are sequentially stacked, may be formed on the third element region C of the substrate 100.

Meanwhile, while the first to third active layers 105a, 105b and 105c and the first to third sacrificial layers 102a, 102b and 102c are sequentially etched using the first to third hard mask patterns 109a, 109b and 109c as etch masks, the substrate 100 may be partially etched.

While the first to third active layers 105a, 105b and 105c and the first to third sacrificial layers 102a, 102b and 102c are sequentially etched using the first to third hard mask patterns 109a, 109b and 109c as etch masks, the bulk body element region of the substrate 100 may be etched using the fourth hard mask pattern to form a trench defining an active region.

A first isolation region 112 filling the trench may be formed (S110). More specifically, after the trench is filled, an insulating layer may be formed on the substrate 100 having the trench, and the insulating layer may be planarized until upper surfaces of the first to third hard mask patterns 109a, 109b and 109c are exposed. As a result, the first isolation region 112 filling the trench may be formed. The first isolation region 112 may be formed of an insulating material having an etch selectivity with respect to the sacrificial patterns 103a, 103b and 103c. For example, when the sacrificial patterns 103a, 103b and 103c are formed of a silicon germanium layer, the first isolation region 112 may be formed of a silicon oxide layer. Accordingly, the first to third sacrificial patterns 103a, 103b and 103c and the first to third active patterns 106a, 106b and 106c on the first to third element regions A, B and C may be defined by the first isolation region 112, and the active region of the bulk body element region may be defined by the first isolation region 112 (S110).

Referring to FIGS. 1C, 4A, 4B, 4A and 14, a first photoresist pattern 115a having at least one opening crossing the first active patterns 105a on the first element region A and covering the second element region B, the third element region C and the bulk body element region may be formed.

In the first element region A, the first isolation region 112 may be etched using the first photoresist pattern 115a as an etch mask to form first recessed regions 112a that partially exposes the first sacrificial patterns 103a (S120). For example, the first recessed regions 112a of the first element region A may partially expose sidewalls of each of the first sacrificial patterns 103a and the active patterns 106a, which are sequentially stacked. As a result, sidewalls of the first active patterns 106a, which are not exposed through the first recessed regions 112a, may be in contact with the first isolation region 112. Then, the first sacrificial patterns 103a below the first active patterns 106a may be selectively removed to form empty spaces 118a between the first active patterns 106a and the substrate 100 (S130). The first sacrificial patterns 103a may be removed using a wet etching process. Here, the first active patterns 106a spaced apart from the substrate 100 by the empty spaces 118a may be in contact with a portion of the first isolation region 112, which is not recessed, to be supported.

Referring to FIGS. 1D, 5A, 5B, 5C and 14, the first photoresist pattern 115a may be removed. In the first element region A, the first buried dielectric layer 122a may be formed on the substrate 100 and the first active patterns 106a, both of which are exposed through the first empty spaces (118a of FIG. 4A) and the first recessed regions (112a of FIG. 4A) (S140). The first buried dielectric layer 122a may includes a first lower buried dielectric layer 121a formed on the substrate 100 exposed through the first empty space (118a of FIG. 4A) and the first recessed regions (112a of FIG. 4A) and a first upper buried dielectric layer 121b formed on the first active patterns 106a exposed through the first empty space (118a of FIG. 4A) and the first recessed region (112a of FIG. 4A). The first buried dielectric layer 122a may be formed of silicon oxide or a high-k dielectric material having a higher dielectric constant than the silicon oxide.

Meanwhile, the first buried dielectric layer 122a may be formed to include an data storage layer. The data storage layer may be a charge trap layer of a flash memory device. For example, the first buried dielectric layer 122a may be an ONO layer including a first oxide layer, a nitride layer as a charge trap layer and a second oxide layer. Meanwhile, a nanocrystal material may be used for the data storage layer.

A first buried layer 123a filling the first empty spaces (118a of FIG. 4A) and filling at least a lower region of the first recessed regions (112a of FIG. 4A) may be formed on the substrate having the first buried dielectric layer 122a. Preferably, the first buried layer 123a may be formed to fill the first empty spaces (118a of FIG. 4A) and the first recessed regions (112a of FIG. 4A). Forming the first buried layer 123a may include forming a material layer having excellent burying characteristics on the substrate having the first buried dielectric layer 122a and planarizing the material layer until the first to third hard mask patterns 109a, 109b and 109c are exposed.

The first buried layer 123a may be formed of an n-type doped semiconductor layer, a p-type doped semiconductor layer, an undoped semiconductor layer or a metal layer. The semiconductor layer may be a silicon layer, and the metal layer may be a TiN layer or a TaN layer.

A second photoresist pattern 115b having at least one opening crossing the second active patterns 105b on the second element region B and covering the first and third element regions A and C may be formed. In the second element region B, second recessed regions 112b and second empty spaces 118b may be formed using the same method of forming the first recessed regions (112a of FIG. 4A) and the first empty spaces (118a of FIG. 4A) in the first element region A (S120 and S130). That is, the second empty spaces 118b may be a space where the second sacrificial layer (103b of FIG. 4B) is removed.

Referring to FIGS. 1E, 6A, 6B, 6C and 14, the second photoresist pattern 115b may be removed. A second buried dielectric layer 122b and a second buried layer 123b may be formed by substantially the same method of forming the first buried dielectric layer 122a and the first buried layer 123a. More specifically, the second buried dielectric layer 122b may be formed on the substrate 100 and the second active patterns 106b, both of which are exposed through the second empty spaces (118b of FIG. 5B) and the second recessed regions (112b of FIG. 5B) of the second element region B (S140). The second buried dielectric layer 122b may include a second lower buried dielectric layer 121c formed on the substrate 100 exposed through the second empty space (118b of FIG. 5B) and the second recessed region (112b of FIG. 5B) and a second upper buried dielectric layer 121d formed on the second active patterns 106b exposed through the second empty space (118b of FIG. 5B) and the second recessed region (112b of FIG. 5B). The second buried dielectric layer 122b may be formed to have a different thickness from the first buried dielectric layer 122a. Also, the second buried dielectric layer 122b may be formed to include a different material from the first buried dielectric layer 122a.

Meanwhile, the second buried dielectric layer 122b may be formed to include an data storage layer.

A second buried layer 123b filling the second empty spaces (118b of FIG. 5B) and the second recessed regions (112b of FIG. 5B) may be formed on the substrate having the second buried dielectric layer 122b. The second buried layer 123b may be formed of the same material as the first buried layer 123a.

Meanwhile, the second buried layer 123b may be formed to have different characteristics from the first buried layer 123a. For example, when the first buried layer 123a is formed of silicon of a first conductivity type, the second buried layer 123b may be formed of undoped silicon or silicon of a second conductivity type different from the first conductivity type. The first conductivity type may be an n-type or a p-type. In contrast, when the first buried layer 123a is formed of undoped silicon, the second buried layer 123b may be formed of n-type or p-type doped silicon.

A third photoresist pattern 115c having at least one opening crossing the third active patterns 105c on the third element region C and covering the first element and the second element regions A and B may be formed. Third recessed regions 112c and third empty spaces 118c may be formed in the third element region C using substantially the same method of forming the second recessed regions (112a of FIG. 5B) and the second empty spaces (118a of FIG. 5B) in the second element region B (S120 and S130). That is, the third empty spaces 118c may be a space where the third sacrificial layer (103c of FIG. 5C) is removed.

Referring to FIGS. 1F, 7A, 7B, 7C and 14, the third photoresist pattern 115c may be removed. A third buried dielectric layer 122c and a third buried layer 123c may be formed using substantially the same method of forming the second buried dielectric layer 122b and the second buried layer 123b. More specifically, the third buried dielectric layer 122c may be formed on the substrate 100 and the third active patterns 106c, both of which are exposed through the third empty spaces (118c of FIG. 6C) and the third recessed regions (112c of FIG. 6C) of the third element region C (S140). The third buried dielectric layer 122c may include a third lower buried dielectric layer 121e formed on the substrate 100 exposed through the third empty spaces (118c of FIG. 6C) and the third recessed regions (112c of FIG. 6C) and a third upper buried dielectric layer 121f formed on the third active patterns 106c exposed through the third empty spaces (118c of FIG. 6C) and the third recessed regions (112c of FIG. 6C). The third buried dielectric layer 122c may be formed to include a different material layer from the second buried dielectric layer 122b. Meanwhile, the third buried dielectric layer 122c may be formed to include an data storage layer.

A third buried layer 123c filling the third empty spaces (118c of FIG. 6C) and the third recessed regions (112c of FIG. 6C) may be formed on the substrate having the third buried dielectric layer 122c. The third buried layer 123c may be formed to have different characteristics from the second buried layer 123b. For example, when the second buried layer 123b is formed of silicon of a first conductivity type, the third buried layer 123c may be formed of undoped silicon or silicon of a second conductivity type different from the first conductivity type. Alternatively, when the second buried layer 123b is formed of undoped silicon, the third buried layer 123c may be formed of n-type or p-type doped silicon or metal.

Therefore, the first to third buried dielectric layers 122a, 122b and 122c may be formed to include different materials from each other. Also, the first to third buried layers 123a, 123b and 123c may be formed to include materials having different characteristics from each other.

In another exemplary embodiment, hard mask patterns may be used instead of the first to third photoresist patterns 115a, 115b and 115c.

Figure 5A:
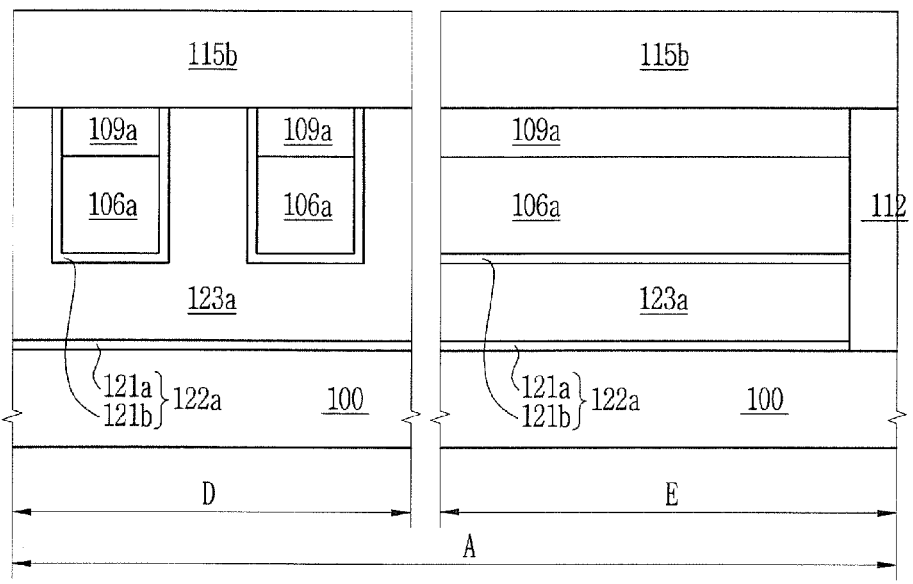
Figure 5B:
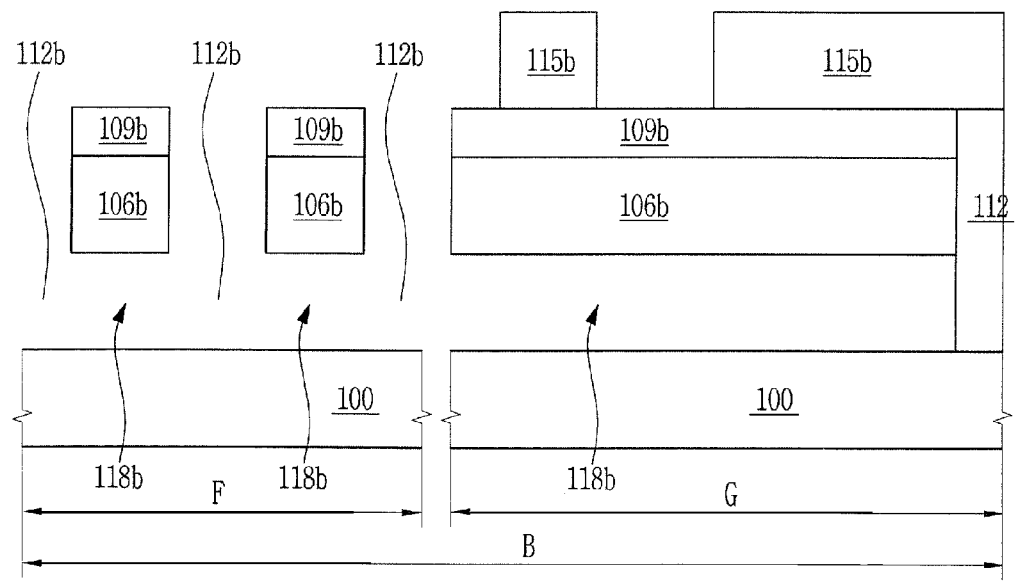
Figure 5C:
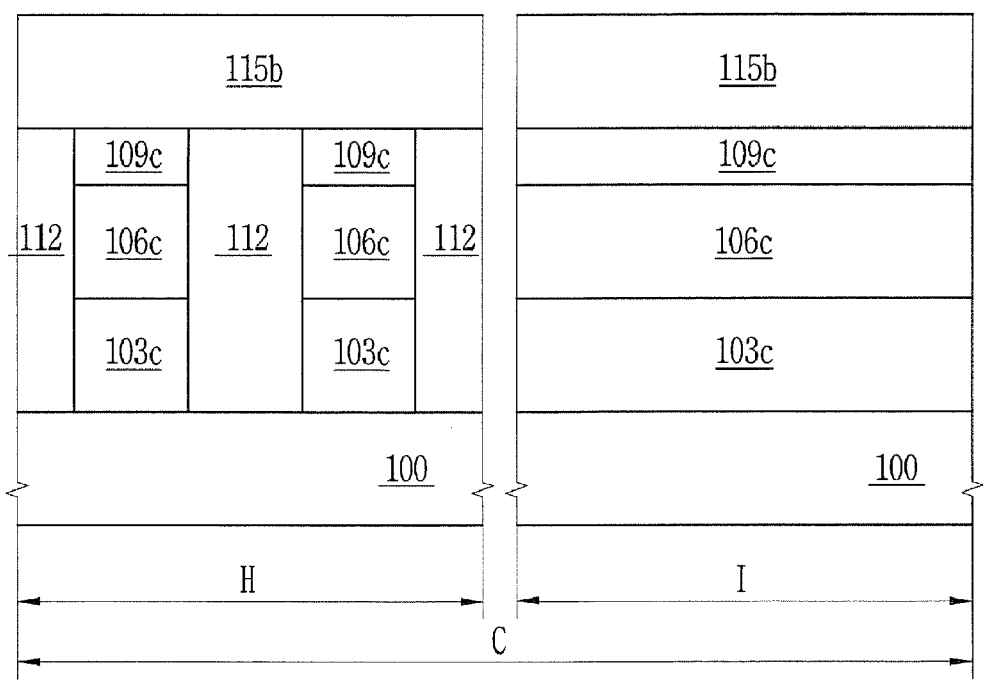
Figure 6A:
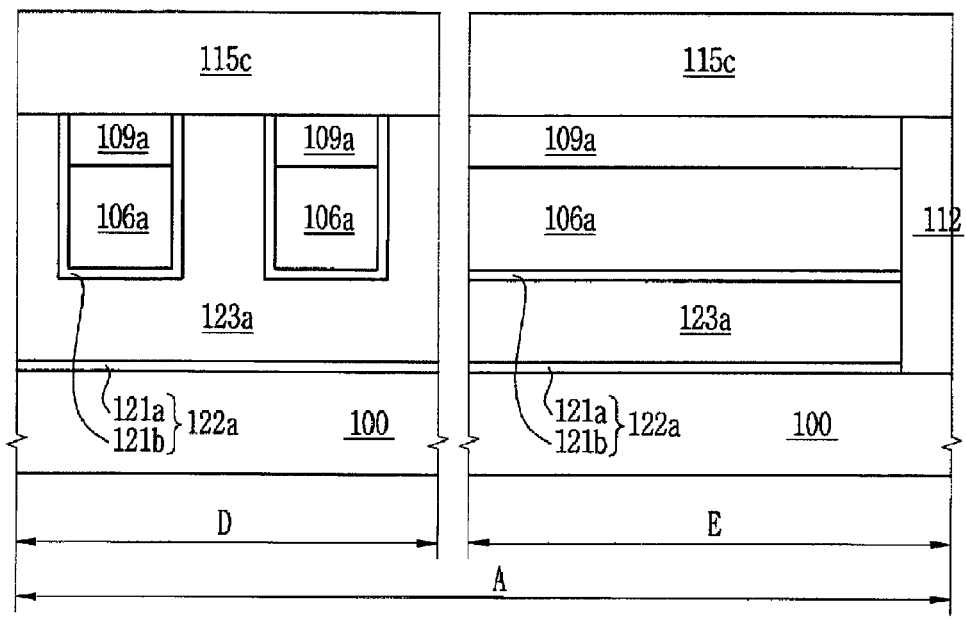
Figure 6B:
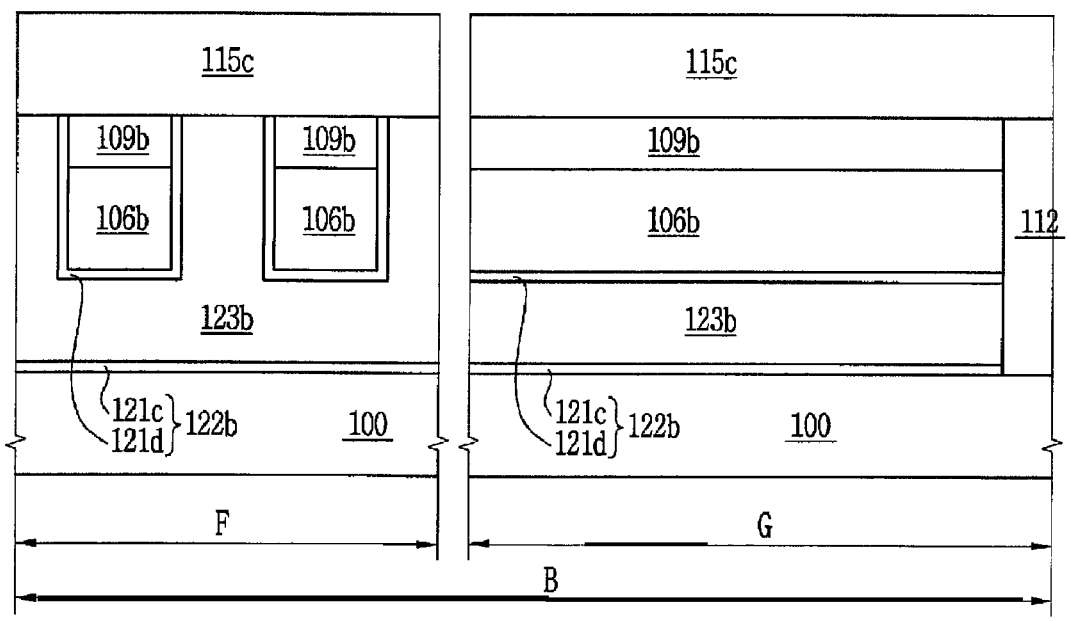
Figure 6C:
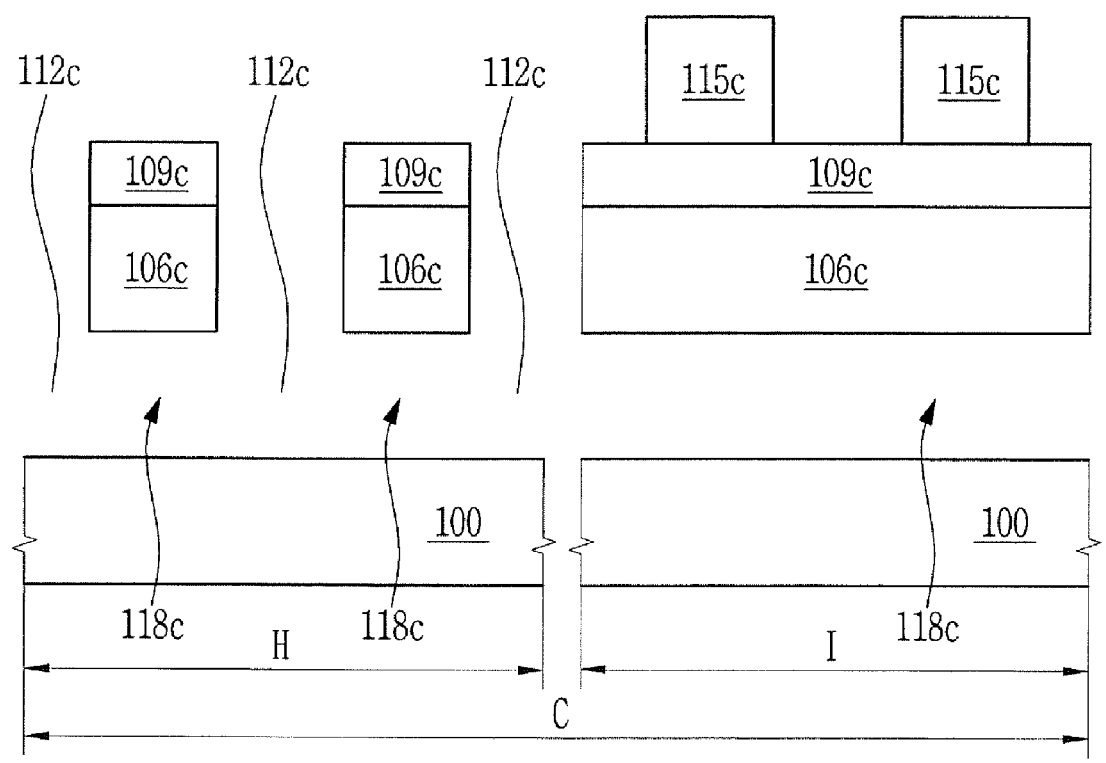
Figure 7A:
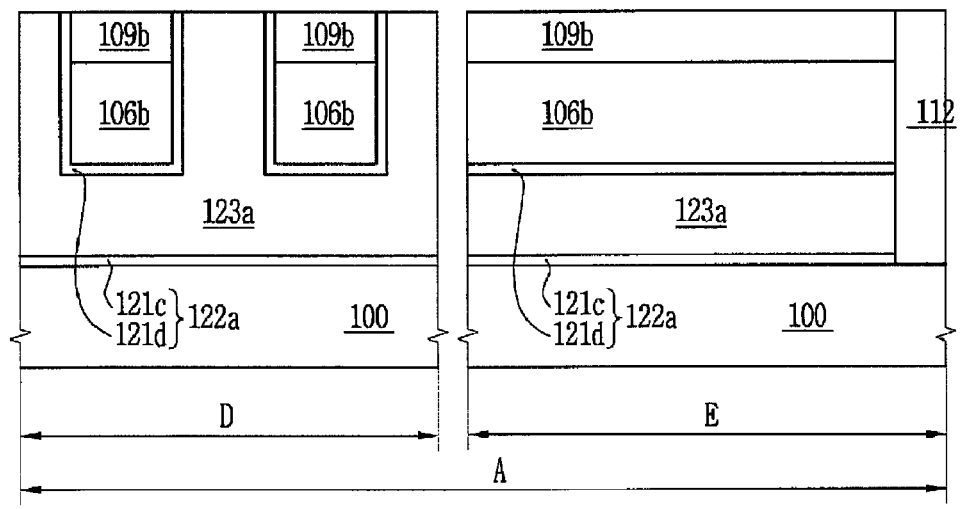
Figure 7B:
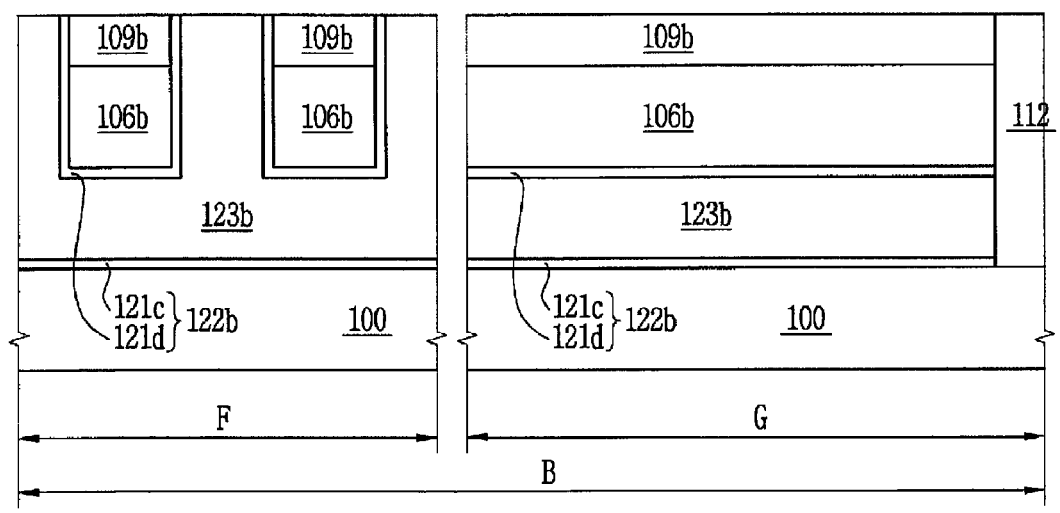
Figure 7C:
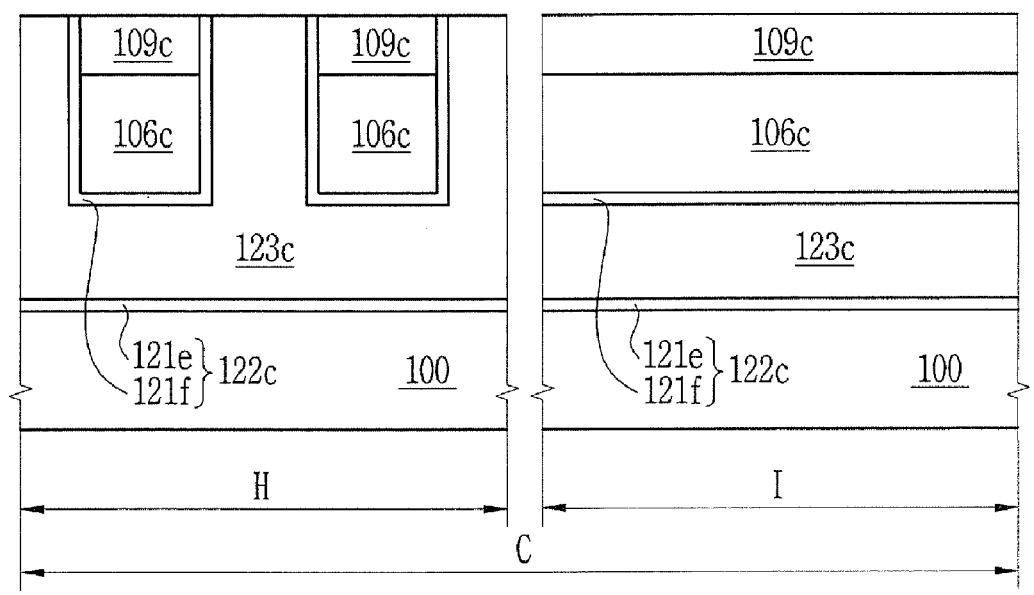

In still another exemplary embodiment, the process described in FIGS. 5A to 5C, the process described in FIGS. 6A to 6C and the process described in FIGS. 7A to 7C may be simultaneously performed. For example, instead of the first photoresist pattern 115a described with reference to FIGS.

5A to 5C, a photoresist pattern having a first opening crossing the first active patterns 106a of the first element region A, a second opening crossing the second active patterns 106b of the second element region B and a third opening crossing the third active patterns 106c of the third element region C may be formed. Then, the isolation region 112 exposed through the openings may be partially etched using the photoresist pattern as an etch mask to simultaneously form the first to third recessed regions 112a of FIG. 4A, 112B of FIG. 5B and 112c of FIG. 6C), and the photoresist pattern may be removed (S120). Further, the first to third sacrificial patterns 103a, 103b and 103c may be simultaneously removed to simultaneously form the first to third empty spaces (118a of FIG. 4A, 118b of FIG. 5B and 118c of FIG. 6C) (S130). As a result, the first to third buried dielectric layers 122a, 122b and 122c may be simultaneously formed, and the first to third buried layers 123a, 123b and 123c may be simultaneously formed.

Referring to FIGS. 1G, 8A, 8B, 8C and 14, in the first element region A, the first buried layer (123a of FIG. 7A) may be etched to form first buried patterns 124a that are self-aligned below the first active patterns 106a (S150). Therefore, the first buried patterns 124a may be spaced apart from each other.

Figure 1G:
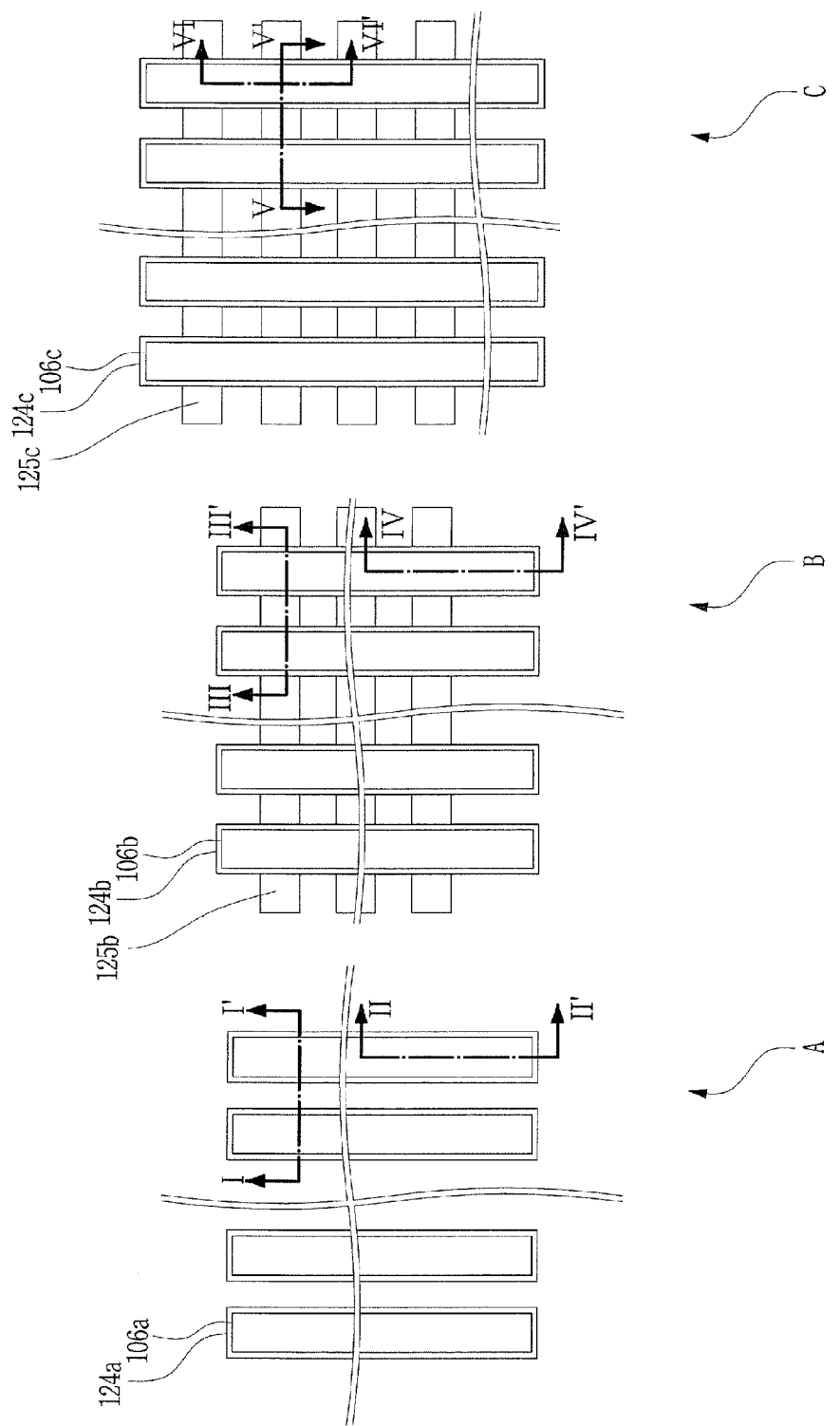

In the second element region B, the second buried layer (123b of FIG. 7B) may be partially etched to form second buried patterns 124b that are self-aligned below the second active patterns 106b, and at least one first connection 125b connecting the second buried patterns 124b to each other may be formed (S150). The first connection 125b may be disposed at substantially the same level as the second buried patterns 124b. As illustrated in FIG. 1G, when the plurality of first connections 125b are formed, as viewed from a plan view, the first connections 125b may be spaced apart from each other to connect the second buried patterns 124b to each other.

In the third element region C, the third buried layer (123c of FIG. 7C) may be partially etched to form third buried patterns 124c that are self-aligned below the third active patterns 106c and at least one second connection 125c connecting the third buried patterns 124c to each other (S150). Here, the second connection 125c may connect the third buried patterns 124c to each other to cover sidewalls of the third active patterns 106c. Here, the sidewalls of the third active patterns 106c and the second connection 125c may be spaced apart from each other by the thickness of the third buried dielectric layer 122c. As illustrated in FIG. 1G, when the plurality of second connections 125c are formed, as viewed from a plan view, the second connections 125c may be spaced apart from each other to connect the third buried patterns 124c to each other.

Then, a second isolation region 127 filling a recessed region formed by etching the first to third buried layers (123a, 123b and 123c of FIGS. 7A to 7C) may be formed. The second isolation region 127 may be formed of an insulating material. For example, the second isolation region 127 may be formed of silicon oxide.

Now, a method of manufacturing a semiconductor device having various gate and interconnection structures in the first to third element regions A, B and C having the first to third buried patterns 123a, 123b and 123c will be described below with reference to FIGS. 1H, 9A to 9C, 10A to 10C and 14.

Referring to FIGS. 1H, 9A to 9C and 14, in the first element region A, predetermined regions of the first active patterns 106a may be removed. For example, the predetermined regions of the first active patterns 106a overlapping a region for forming a lower gate contact structure to be subsequently formed may be removed using a photolithography and etching process.

In the first element region A, after the first hard mask patterns (109a of FIG. 8A) are removed, one or a plurality of first gate structures 136a and one or a plurality of first gate mask patterns 139a, which are sequentially stacked, may be formed on the first active patterns 106a (S160). Each of the first gate structures 136a may include a first gate dielectric layer 130a and a first gate electrode 133a, which are sequentially stacked.

Meanwhile, a plurality of first gate structures 136a may be formed on each of the first active patterns 106a. That is, the first gate structures 136a may be formed in an island shape on the first active patterns 106a.

The first gate dielectric layer 130a may be formed of silicon oxide or a high-k dielectric material having a higher dielectric constant than the silicon oxide. The first gate electrode 133a may be formed of a conductive layer.

Meanwhile, the first gate dielectric layer 130a may be formed of the same material as the first buried dielectric layer 122a. For example, when the first buried dielectric layer 122a is formed of dielectrics including an data storage layer and the first gate dielectric layer 130a is formed of the same material as the first buried dielectric layer 122a, the first element region A may be used as a cell region of a flash memory device having a multi-bit storage node, e.g., a 4-bit storage node. Furthermore, when the first gate dielectric layer 130a and the first buried dielectric layer 122a are formed of the same material and formed to the same thickness, programming/erasing/reading may be performed by the same operating voltage.

The first gate mask patterns 139a may be formed of an insulating material. For example, the first gate mask patterns 139a may be formed to include at least one of a silicon oxide layer and a silicon nitride layer.

In the second element region B, predetermined regions of the second active patterns 106b may be removed. For example, the predetermined regions of the second active patterns 106b overlapping a region for forming a lower gate contact structure to be subsequently formed may be removed using a photolithography and etching process. In the second element region B, after the second mask patterns (109b of FIG. 8B) are removed, second gate structures 136b and second gate mask patterns 139b, which are sequentially stacked, may be formed on the second active patterns 106b (S160). Each of the second gate structures 136b may include a second gate dielectric layer 130b and a second gate electrode 133b, which are sequentially stacked. The second gate dielectric layer 130b may be formed of the same dielectric layer as the first gate dielectric layer 130a or a different dielectric layer from the first gate dielectric layer 130a.

Meanwhile, the second gate structures 136b may be formed to cover at least one of the sidewalls of the second active patterns 106b. Further, second gate structures 136b may be formed to cover upper surfaces of the second active patterns 106b. Here, before forming the second gate structures 136b, the second isolation region 117 adjacent to the second active patterns 106b may be etched using a photolithography or etching process to form a recessed region exposing the sidewalls of the second active patterns 106b so that the second gate structures 136b cover at least one of the sidewalls of the second active patterns 106b.

The second gate dielectric layer 130b may be formed of silicon oxide or a high-k dielectric material having a higher dielectric constant than the silicon oxide. The second gate electrode 133b may be formed of a conductive layer. Meanwhile, the second gate dielectric layer 130b may be formed to include an data storage layer.

Meanwhile, the second gate dielectric layer 130b may be formed of the same material as the second buried dielectric layer 122b.

The second gate mask patterns 139b may be formed of an insulating material. For example, the second gate mask patterns 139b may be formed to include at least one of a silicon oxide layer and a silicon nitride layer.

In the third element region C, predetermined regions of the third active patterns 106c may be removed. For example, the predetermined regions of the third active patterns 106c overlapping a region for forming a lower gate contact structure to be subsequently formed may be removed using a photolithography and etching process. In the third element region C, after the third mask patterns (109c of FIG. 8C) are removed, third gate structures 136c and third gate mask patterns 139c, which are sequentially stacked on the third active patterns 106c, may be formed (S160). Each of the third gate structures 136c may include a third gate dielectric layer 130c and a third gate electrode 133c, which are sequentially stacked. The third gate dielectric layer 130c may be formed of the same dielectrics as the first and second gate dielectric layers 130a and 130b or different dielectrics from the first and second gate dielectric layers.

The third gate dielectric layer 130c may be formed of silicon oxide or a high-k dielectric material having a higher dielectric constant than the silicon oxide. The third gate electrode 133c may be formed of a conductive layer. Meanwhile, the third gate dielectric layer 130c may be formed to include an data storage layer. The third gate mask patterns 139c may be formed of an insulating material.

Meanwhile, the third gate dielectric layer 130c may be formed of the same material as the third buried dielectric layer 122c.

Figure 8A:
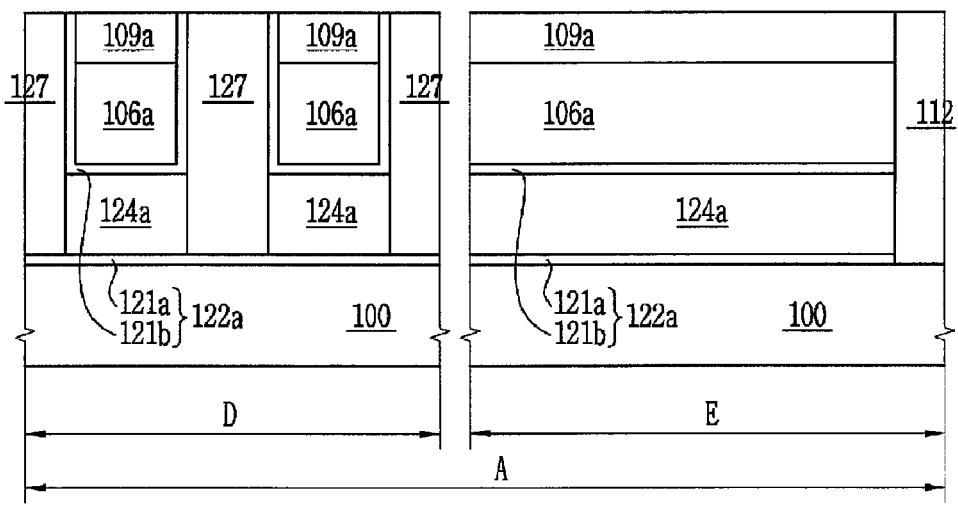
Figure 8B:
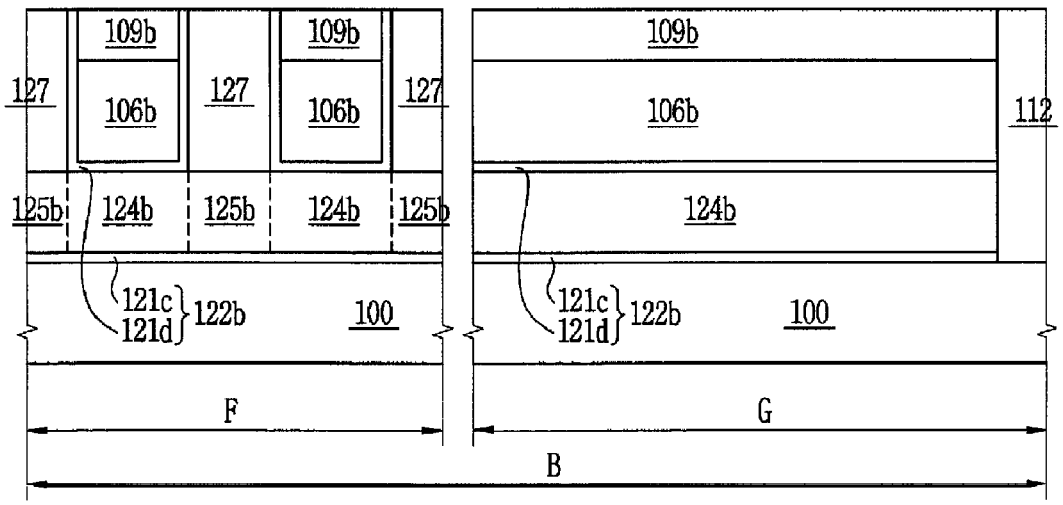
Figure 8C:
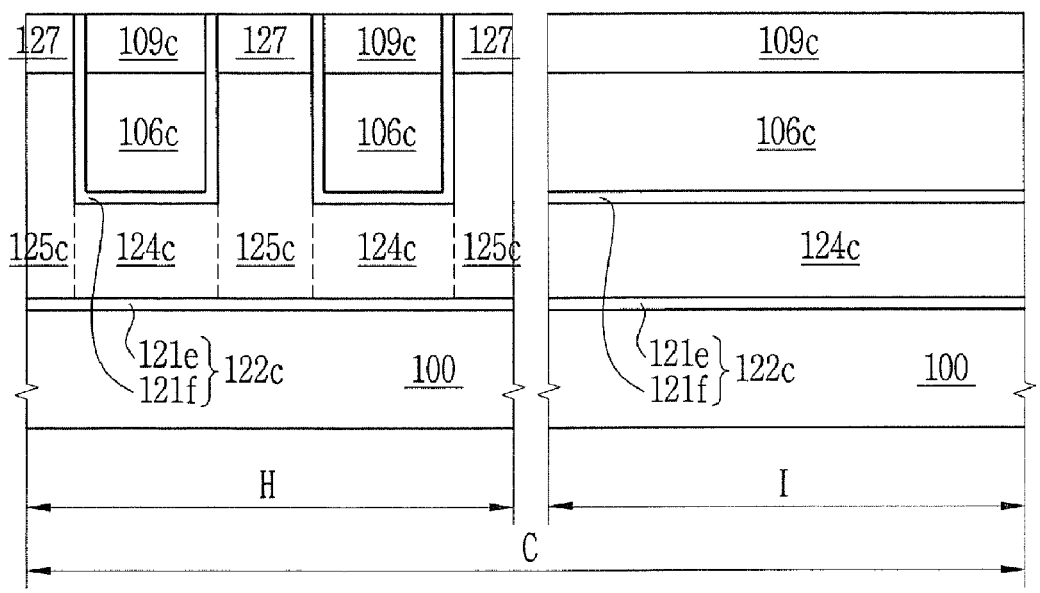
Figure 9A:
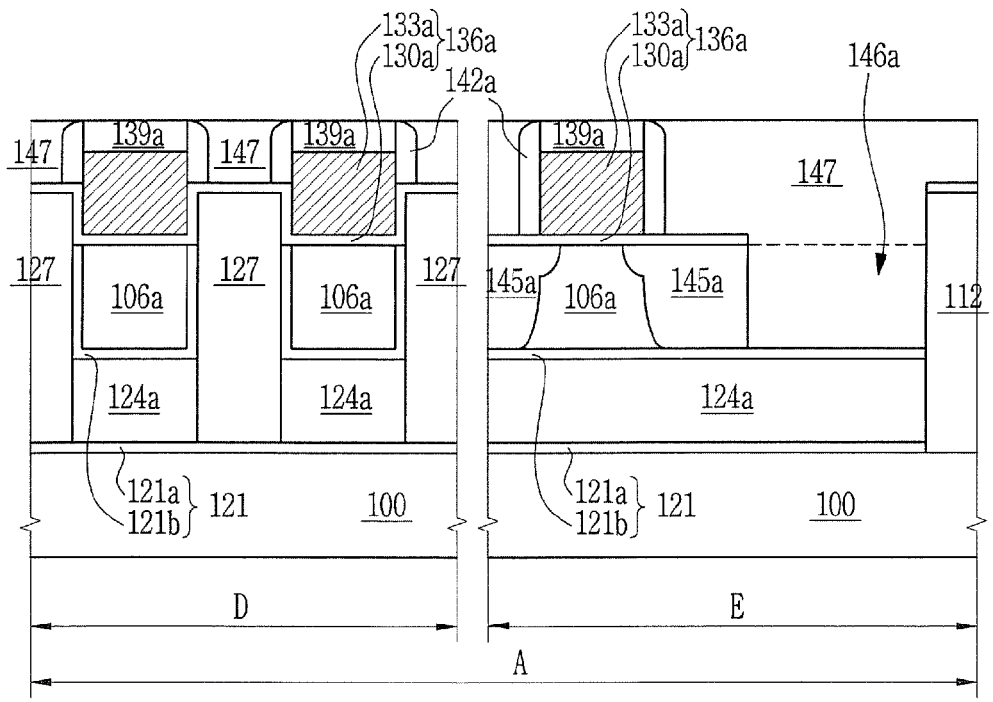
Figure 9B:
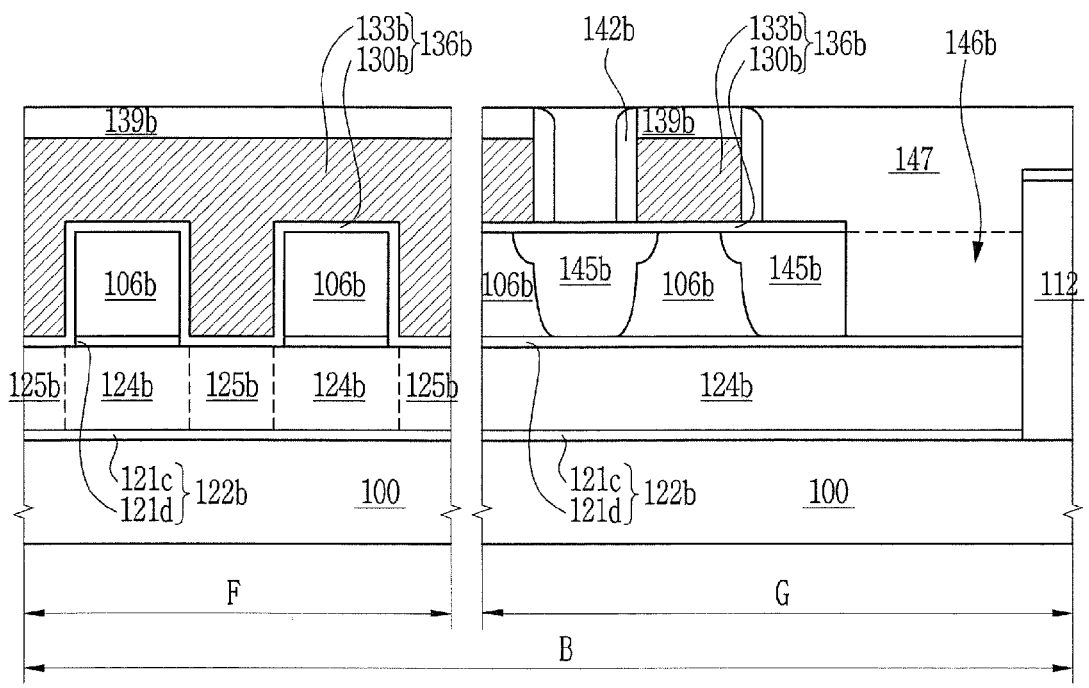
Figure 9C:
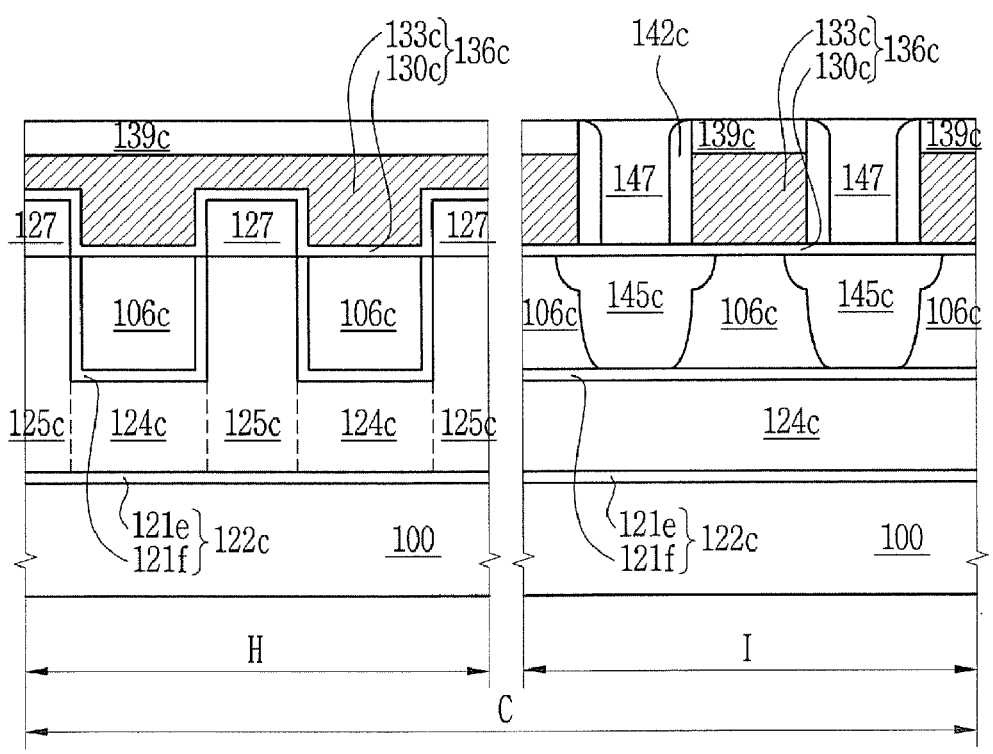
Figure 10A:
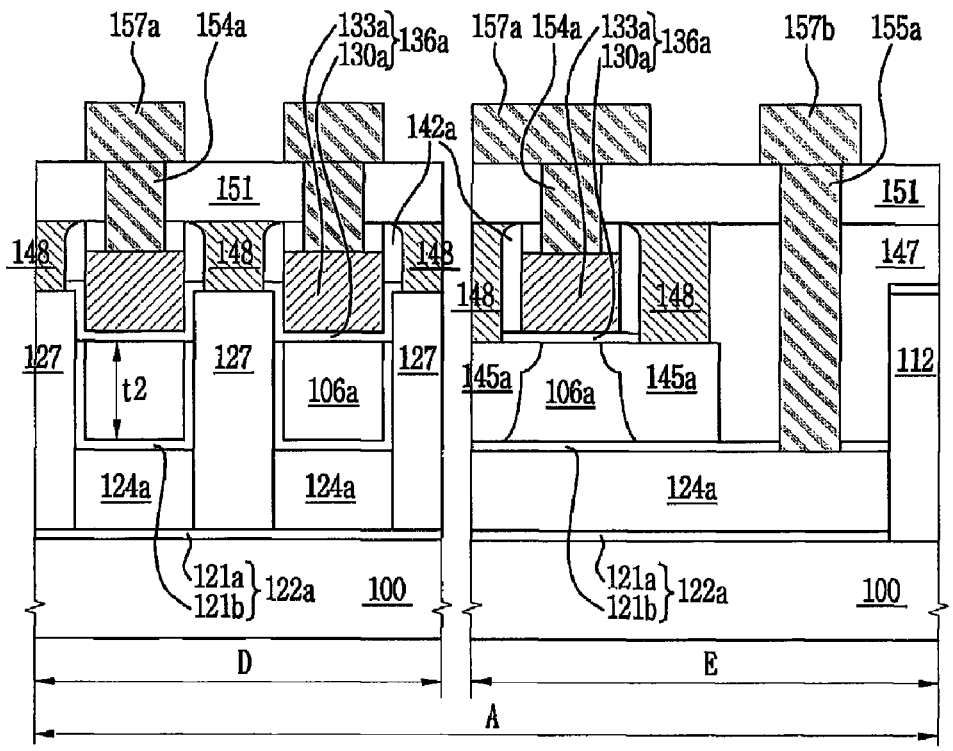
Figure 10B:
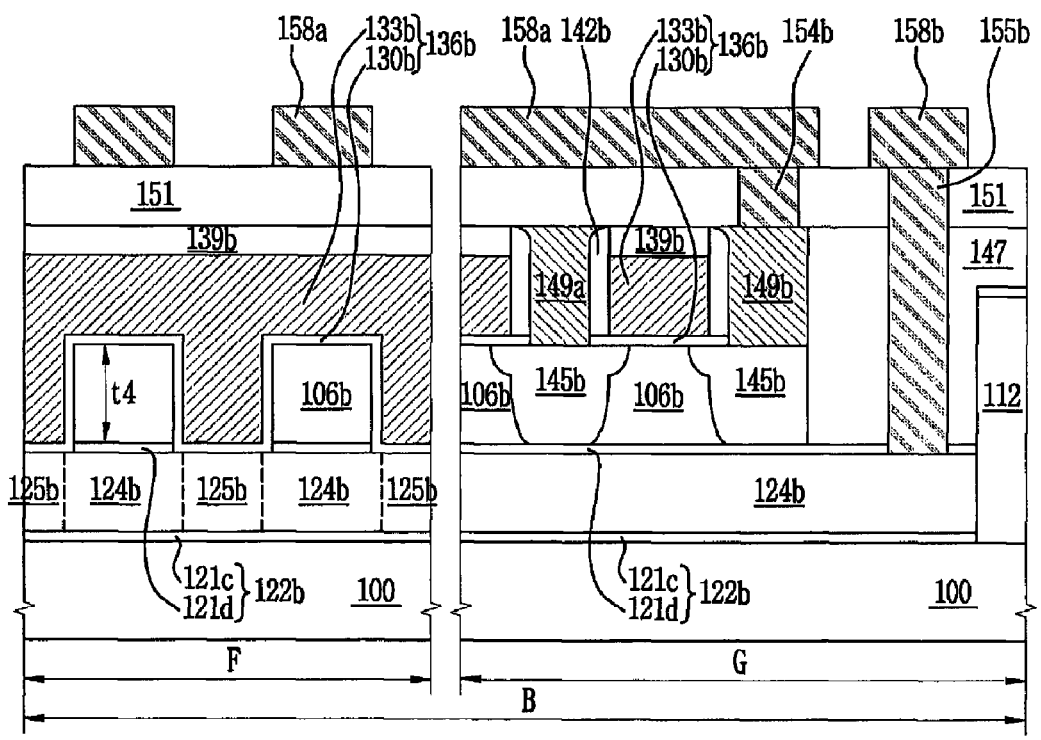
Figure 10C:
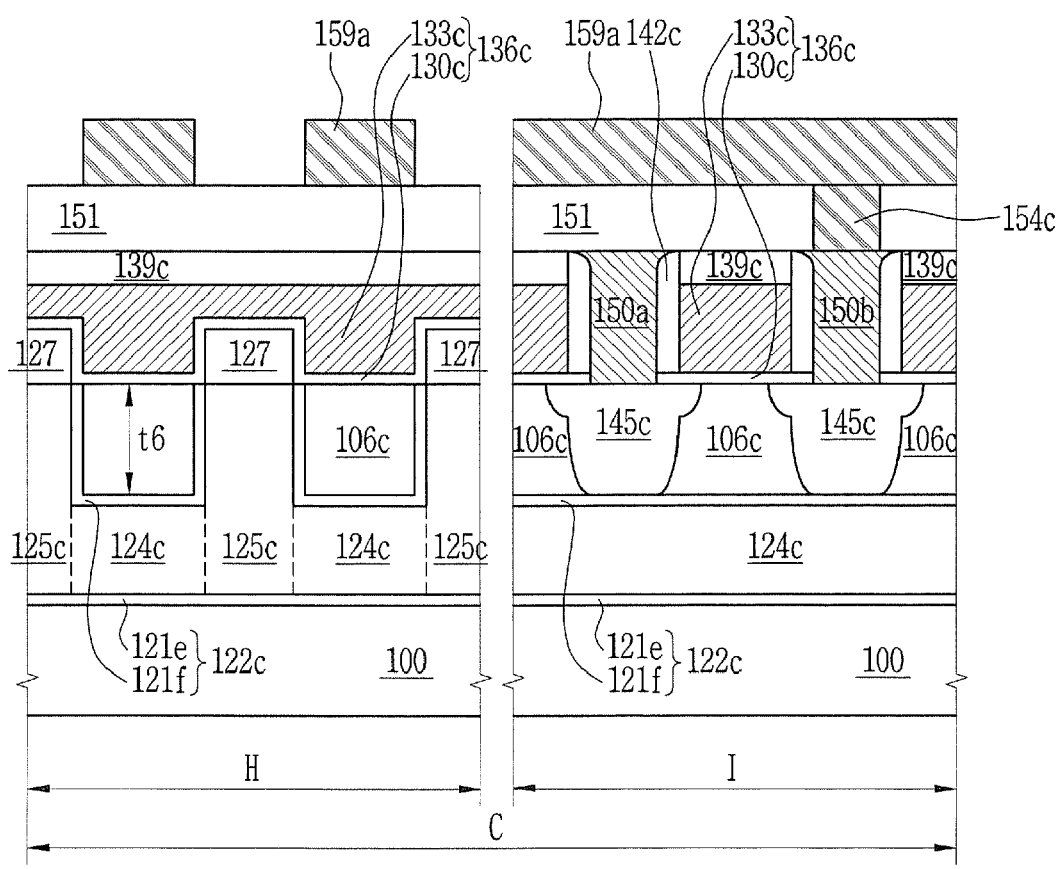

In another exemplary embodiment, the first to third mask patterns 109a, 109b and 109c of FIGS. 8A to 8C) may be simultaneously removed to expose the first to third active patterns 106a, 106b and 106c, to form a first gate dielectric layer 130a on the first active patterns 106a, to form a second gate dielectric layer 130b on the second active patterns 106b and to form a third gate dielectric layer 130c on the third active patterns 106c. Then, a first gate electrode 133a and a first gate mask pattern 139a, which are sequentially stacked, may be formed on the first gate dielectric layer 130a, a second gate electrode 133b and a second gate mask pattern 139b, which are sequentially stacked, may be formed on the second gate dielectric layer 130b, and a third gate electrode 133c and a third gate mask pattern 139c, which are sequentially stacked, may be formed on the third gate dielectric layer 130c (S160).

Meanwhile, while the first to third gate structures 136a, 136b and 136c are formed, in the bulk body element region, the fourth hard mask pattern on the active region may be removed, and then a fourth gate structure may be formed on the active region (S160). The fourth gate structure may include a fourth gate dielectric layer and a fourth gate electrode, which are sequentially stacked.

In the present invention, it is described that the thicknesses of the first to third active patterns 106a, 106b and 106c may be controlled. Therefore, the thicknesses of the first to third active patterns 106a, 106b and 106c may be controlled to form fully or partially depleted transistors. That is, transistors of various characteristics may be provided to design various semiconductor circuits.

First gate spacers 142a may be formed on sidewalls of each of the first gate structures 136a and of the first gate mask patterns 139a, which are sequentially stacked. Second gate spacers 142b may be formed on sidewalls of the second gate structures 136b and the sidewalls of the second gate mask patterns 139b, which are sequentially stacked. Third gate spacers 142c may be formed on sidewalls of each of the first gate structures 136c and the sidewalls of the third gate mask patterns 139c, which are sequentially stacked. The first to third gate spacers 142a, 142b and 142c may be simultaneously formed. The first to third gate spacers 142a, 142b and 142c may be formed of an insulating material. For example, the first to third gate spacers 142a, 142b and 142c may be formed to include at least one of a silicon oxide layer and a silicon nitride layer.

First source/gate regions 145a may be formed in the first active patterns 106a at both sides of the first gate structures 136a. For example, the first source and drain regions 145a may be formed by implanting impurity ions having a different conductivity type from the first active patterns 106a into the first active patterns 106a at both sides of the first gate structures 136a. The first active patterns 106a disposed between the first source and drain regions 145a may provide a channel region of a transistor.

Second source and drain regions 145b may be formed in the second active patterns 106b at both sides of the second gate structures 136b. For example, impurity ions having a different conductivity type from the second active patterns 106b may be implanted into the second active patterns 106b at both sides of the second gate structures 136b to form the second source and drain regions 145b.

Third source and drain regions 145c may be formed in the third active patterns 106c at both sides of the third gate structures 136c. For example, impurity ions having a different conductivity type from the third active patterns 106c may be implanted into the third active patterns 106c at both sides of the third gate structures 136c to form the third source and drain regions 145c.

Meanwhile, when a floating body DRAM cell array is formed in the third element region C, the third active patterns 106c between the third source and drain regions 145c may provided a data storage region.

A lower interlayer insulating layer 147 may be formed on the substrate having the first to third source and drain regions 145a, 145b and 145c. The lower interlayer insulating layer 147 may be formed of silicon oxide or a low-k dielectric material.

Referring to FIGS. 1H, 10A, 10B, 10C and 15, in the first element region A, the lower interlayer insulating layer 147 may be patterned to form line-shaped first trenches that cross the first active patterns 106a and expose the first source and drain regions 145a and to form line-shaped first lower conductive patterns 148 filling the first trenches. Therefore, the first lower conductive patterns 148 may pass through the lower interlayer insulating layer 147 and may be electrically connected to the first source and drain regions 145a. Each of the first lower conductive patterns 148 may be disposed between the first gate electrodes 133a and may be spaced apart from the first gate electrodes 133a by the first gate mask patterns 139a and the first gate spacers 142a. When a cell array of a memory device is formed in the first element region A, the first lower conductive patterns 148 may provide bit lines.

Figure 1H:
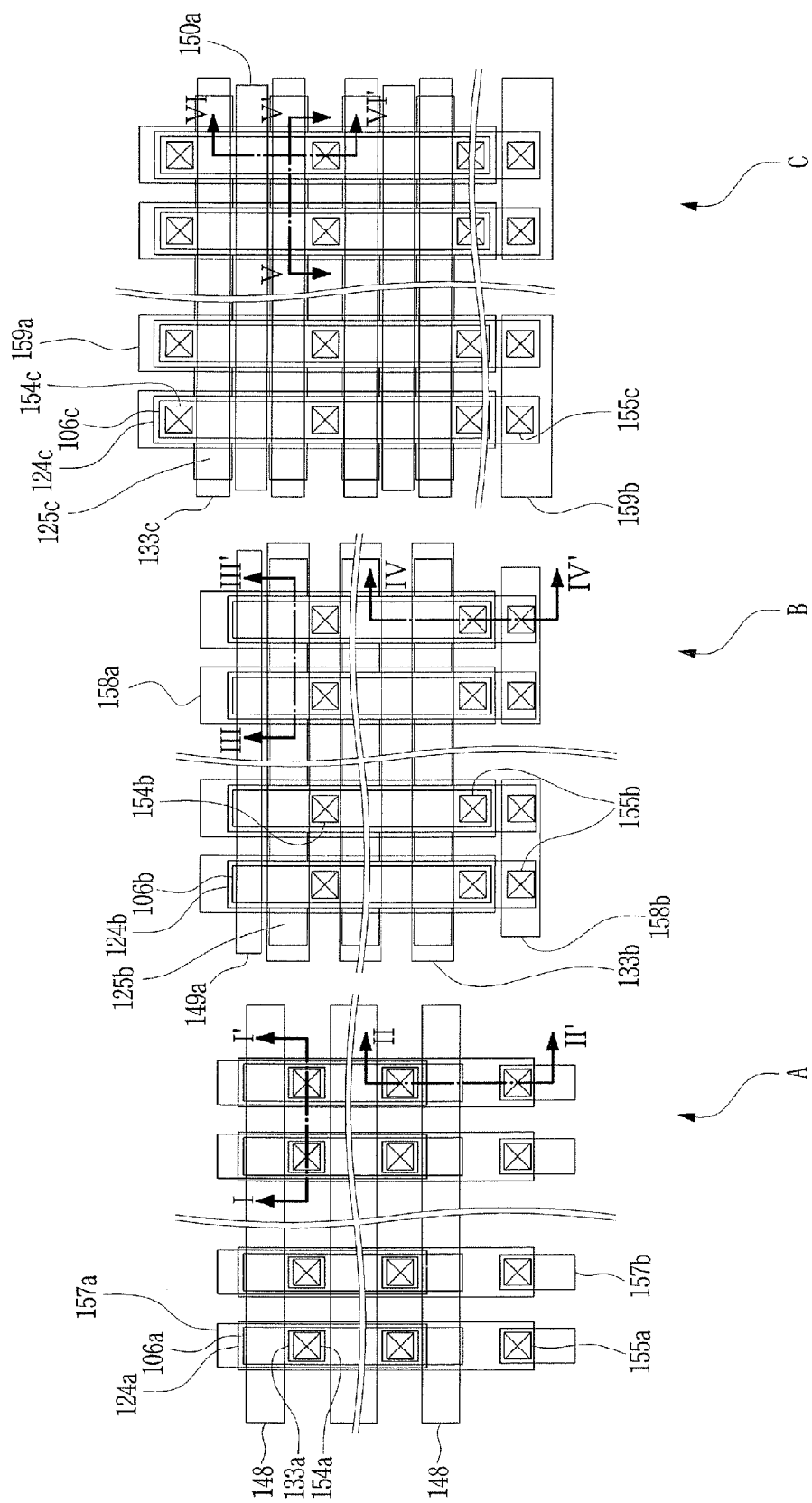
Figure 2A:
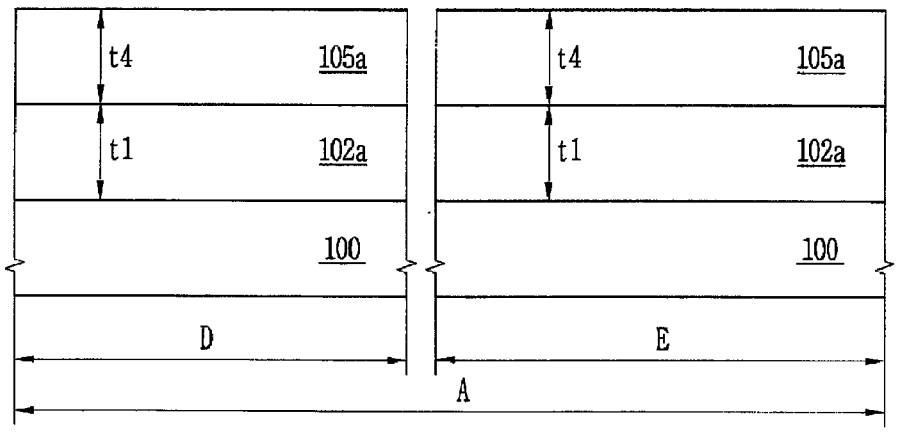
FIGS. 2A to 2C, 3A to 3C, 4A to 4C, 5A to 5C, 6A to 6C, 7A to 7C, 8A to 8C, 9A to 9C and 10A to 10C are cross-sectional views of a semiconductor device according to an exemplary embodiment of the present invention.
Figure 2B:
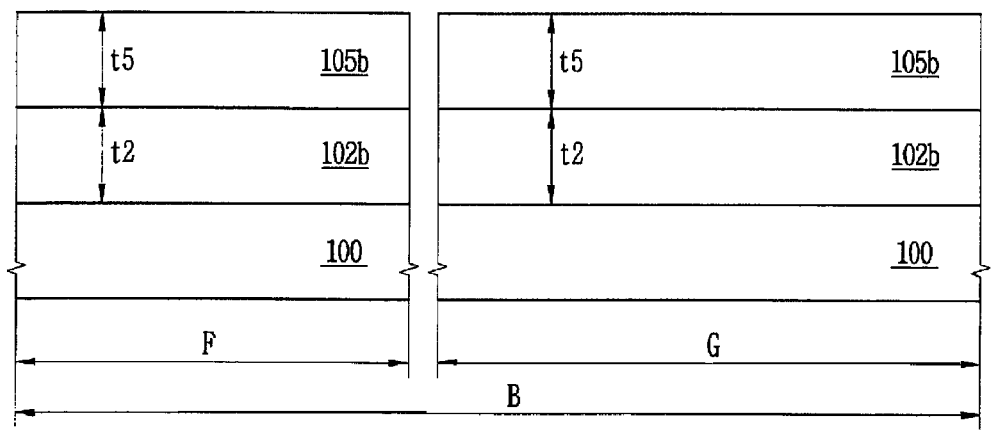
Figure 2C:
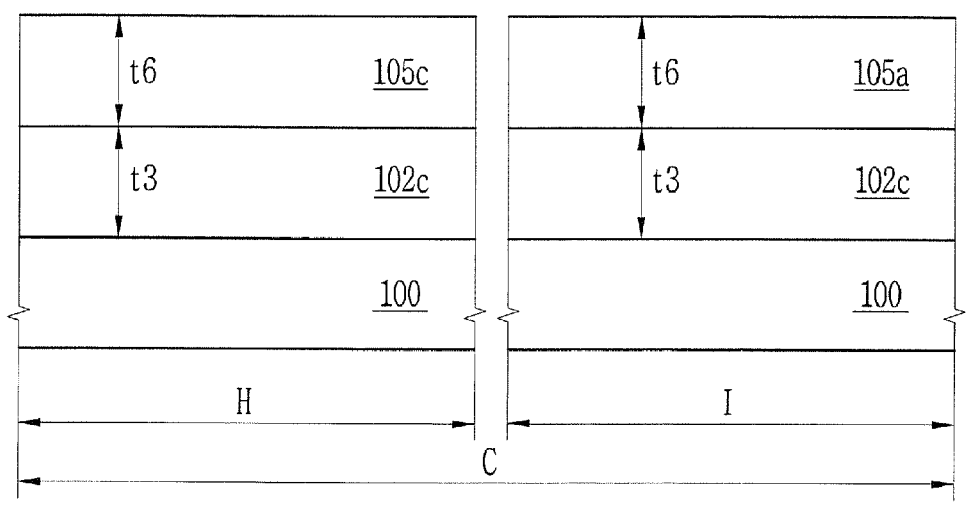
Figure 3A:
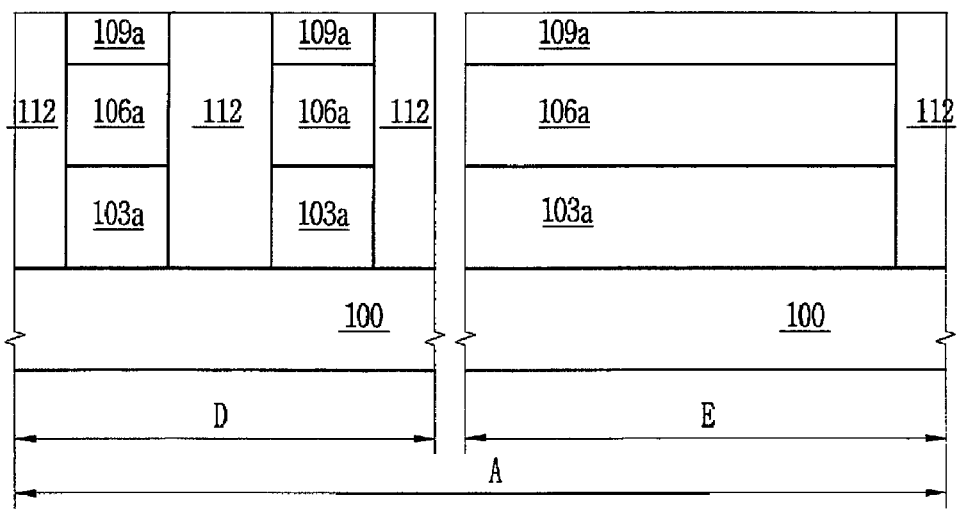
Figure 3B:
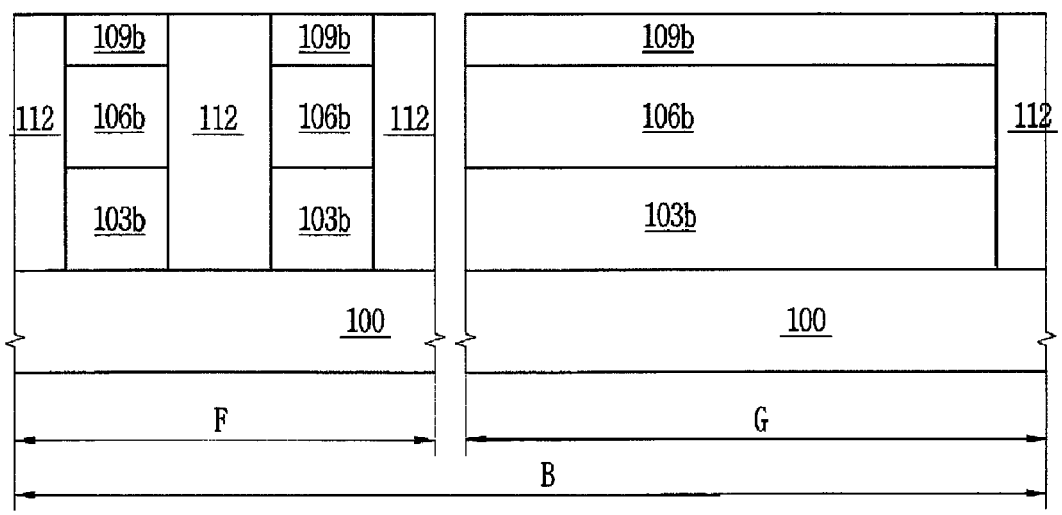
Figure 3C:
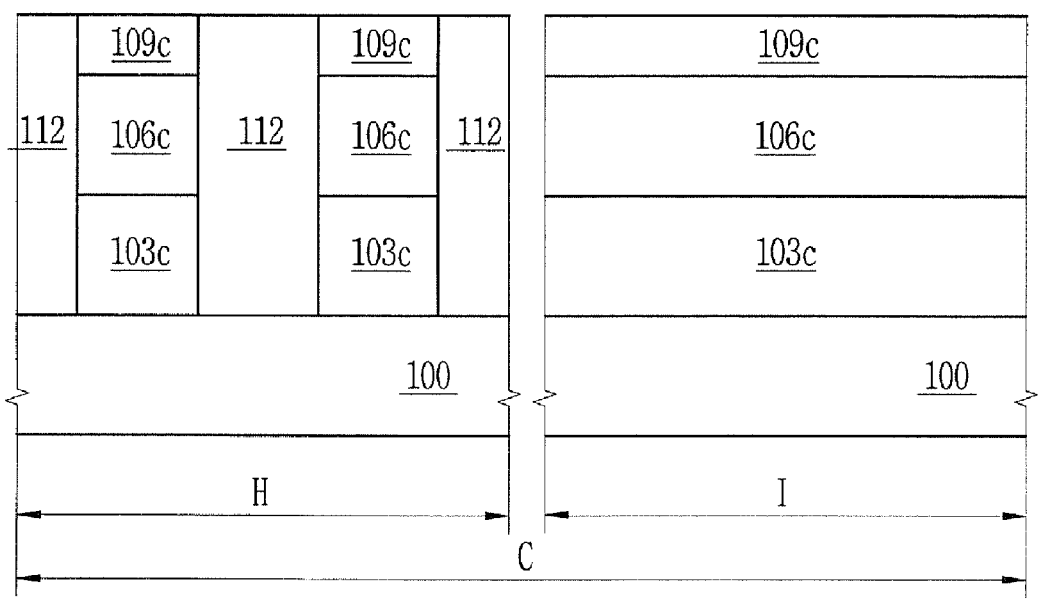

In the second element region B, the lower interlayer insulating layer 147 may be patterned to form line-shaped second trenches crossing the second active patterns 106b and exposing one of the second source and drain regions 145b, to form second contact holes exposing the other one of the second source and drain regions 145b, to form second lower conductive patterns 149a filling the second trenches and to form second lower contact structures 149b filling the second contact holes. Therefore, the second lower conductive patterns 149a may be electrically connected to one of the second source and drain regions 145b, and the second lower contact structures 149b may be electrically connected to the other one of the second source and drain regions 145b. As illustrated in FIG. 1H, the second lower conductive patterns 149a may be formed in a line shape to cross the plurality of second active patterns 106b, and the second lower contact structures 149b may be formed in an island shape.

In the third element region C, the lower interlayer insulating layer 147 may be patterned to form line-shaped third trenches crossing the third active patterns 106c and exposing one of the third source and drain regions 145c, to form third contact holes exposing the other one of the third source and drain regions 145c, to form third lower conductive patterns 150a filling the third trenches and to form third lower contact structures 150b filling the third contact holes. Therefore, the third lower conductive patterns 150a may be electrically connected to one of the third source and drain regions 145c, and the third lower contact structures 150b may be electrically connected to the other one of the third source and drain regions 145c. As illustrated in FIG. 1H, the third lower conductive patterns 150a may be formed in a line shape to cross the plurality of third active patterns 106c, and the third lower contact structures 150b may be formed in an island shape.

Meanwhile, the first to third lower conductive patterns 148a, 149a and 150a and the second and third lower contact structures 149b and 150b may be simultaneously formed.

Then, an upper interlayer insulating layer 151 may be formed on the substrate having the first to third lower conductive patterns 148a, 149a and 150a and the second and third lower contact structures 149b and 150b. The upper interlayer insulating layer 151 may be formed of silicon oxide.

In the first element region A, first gate contact structures 154a passing through the upper interlayer insulating layer 151 and electrically connected to the first gate electrodes 133a may be formed. Subsequently, line shaped first upper conductive lines 157a formed with an orientation to cross the first active patterns 106a and covering the first gate contact structures 154a may be formed on the upper interlayer insulating layer 151. Therefore, the plurality of first gate electrodes 133a may be electrically connected to each of the first upper conductive lines 157a. As a result, a multi-bit flash memory cell may be formed at intersections of the first upper conductive patterns 157a and the first active patterns 106a.

Meanwhile, first lower gate contact structures 155a passing through the upper interlayer insulating layer 151 and the lower interlayer insulating layer 147 and electrically connected to the first buried patterns 124a may be formed (S170). First lower gate interconnections 157b covering the first lower gate contact structures 155a may be formed on the upper interlayer insulating layer 151. Accordingly, an individual electric signal may be applied to each of the first buried patterns 124a through the first lower gate interconnections 157b.

Meanwhile, the first upper conductive patterns 157a and the first lower gate interconnections 157b may be simultaneously formed.

In the second element region B, second upper contact structures 154b passing through the upper interlayer insulating layer 151 and electrically connected to the second lower contact structures 149b may be formed. Subsequently, second upper conductive patterns 158a formed with an orientation to cross the second gate electrodes 133b and covering the second upper contact structures 154b may be formed on the upper interlayer insulating layer 151.

Meanwhile, second lower gate contact structures 155b passing through the upper interlayer insulating layer 151 and the lower interlayer insulating layer 147 and electrically connected to the second buried patterns 124b may be formed (S170). Second lower gate interconnections 158b covering the second lower gate contact structures 155b may be formed on the upper interlayer insulating layer 151. Therefore, since the second buried patterns 124b are electrically connected to each other by the second connection 125b, an electric signal may be applied to the entire second buried patterns 124b that are electrically connected to each other by the second lower gate interconnections 158b.

Meanwhile, the second upper conductive patterns 158a and the second lower gate interconnections 158b may be simultaneously formed.

In the third element region C, third upper contact structures 154c passing through the upper interlayer insulating layer 151 and electrically connected to the third lower contact structures 150b may be formed. Subsequently, line-shaped third upper conductive patterns 159a formed with an orientation to cross the third gate electrodes 133c and covering the third upper contact structures 154c may be formed on the upper interlayer insulating layer 151.

Meanwhile, third lower gate contact structures 155c passing through the upper interlayer insulating layer 151 and the lower interlayer insulating layer 147 and electrically connected to the third buried patterns 124c may be formed (S170). Third lower gate interconnections 159b covering the third lower gate contact structures 155c may be formed on the upper interlayer insulating layer 151.

Also, the third upper conductive patterns 159a and the third lower gate interconnections 159b may be simultaneously formed.

Further, the first to third upper conductive patterns 157a, 158a and 159a may be simultaneously formed.

As described above, a semiconductor device such as a system-on-chip having elements of various structures may be manufactured. For example, as illustrated in FIG. 16, a semiconductor device 550 having various element regions, e.g., first to fifth regions 500, 510, 520, 530 and 540 may be manufactured. That is, a semiconductor device having various integrated circuit devices may be formed on the semiconductor device 500. For example, as illustrated in FIG. 17, a first passivation layer 560 may be formed on the semiconductor device 550, and an integrated circuit substrate 600 may be formed on the first passivation layer 560. Various integrated circuits may be formed on the integrated circuit substrate 600. An intersubstrate interconnection 610 electrically connecting integrated circuits of the integrated circuit substrate 600 to the semiconductor device 550 may be formed. Then, a second passivation layer 620 covering the integrated circuit substrate 600 and the intersubstrate interconnection 610 may be formed.

Next, a method of manufacturing a semiconductor device according to another exemplary embodiment of the present invention will be described with reference to FIGS. 11A to 11F, 12A to 12F and 15.

Referring to FIGS. 11A, 12A and 15, a substrate 200 having a plurality of element regions may be prepared. For example, the substrate 200 may have a floating body element region J and a bulk body element region K (S200). The substrate 200 may be a semiconductor substrate. For example, the substrate 200 may be a silicon substrate. A sacrificial layer and an active layer, which are sequentially stacked, may be formed on the floating body element region J of the substrate 200 using substantially the same method of FIGS. 2A to 2C. Meanwhile, before forming the sacrificial layer and the active layer, the floating body element region J of the substrate 200 may be partially etched to be recessed. As a result, an upper surface of the bulk body element region K of the substrate 200 may be disposed at the same level as an upper surface of the active layer of the floating body element region J. In addition, the bulk body element region K of the substrate 200 may be formed using an epitaxial growth technique so that the upper surface of the bulk body element region K of the substrate 200 may be disposed at the same level of the upper surface of the floating body element region J.

First hard mask patterns 209a may be formed on the floating body element region L of the substrate 200, and second hard mask patterns 209b may be formed on the bulk body element region K of the substrate 200.

Subsequently, the sequentially stacked sacrificial layer and active layer on the floating body element region L may be etched using the first and second hard mask patterns 209a and 209b as etch masks to define sacrificial patterns 203a and preliminary active patterns 206a, which are sequentially stacked, and the substrate 200 of the bulk body element region K may be etched to form a trench defining an active region 212a. Then, a first isolation region 212 filling the trench may be formed. Accordingly, the sacrificial patterns 203a and the preliminary active patterns 206a, which are sequentially stacked on the floating body element region L of the substrate 200 and the active region 212a on the bulk body element region K of the substrate 200 may be defined by the first isolation region 212 (S210).

Referring to FIGS. 11B, 12B and 15, a first photoresist pattern 215 having an opening crossing over the preliminary active patterns 206a in the floating body element region J and covering the bulk body element region K of the substrate may be formed on the substrate having the first isolation region 212. The first isolation region 212 may be etched using the first photoresist pattern 215 as an etch mask to form a recessed region 213 partially exposing sidewalls of the sacrificial patterns 203a (S220).

Meanwhile, the first photoresist pattern 215 may be formed of a hard mask pattern having substantially the same opening as the first photoresist pattern 215.

Figure 4A:
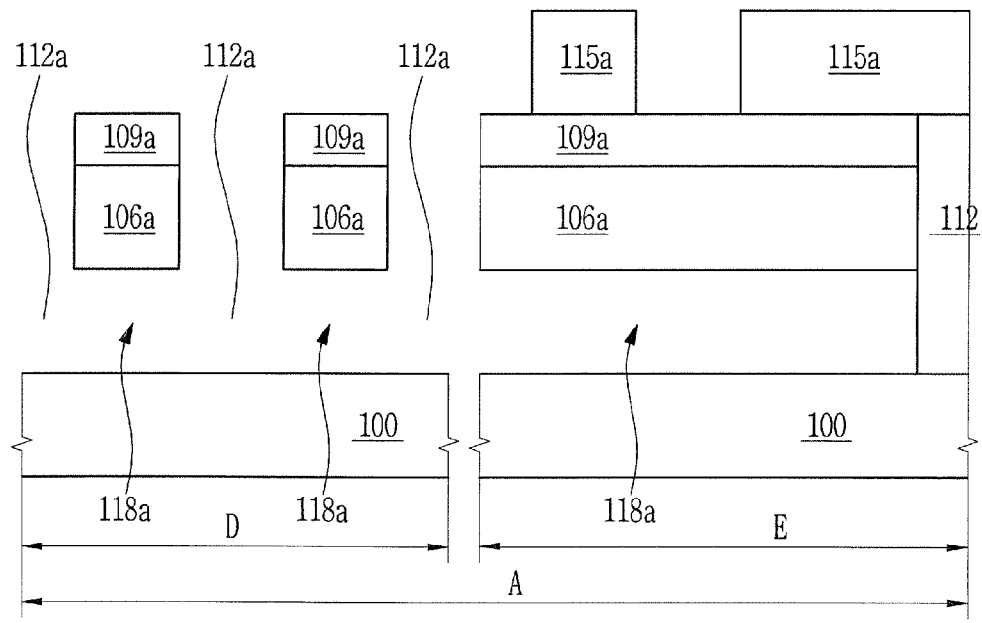
Figure 4B:
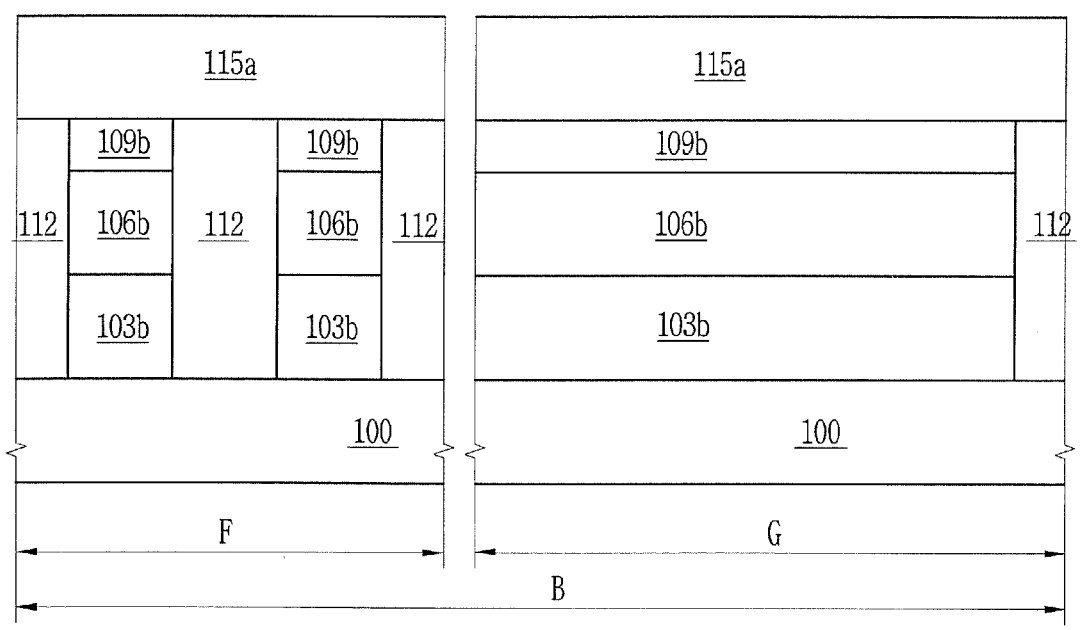
Figure 4C:
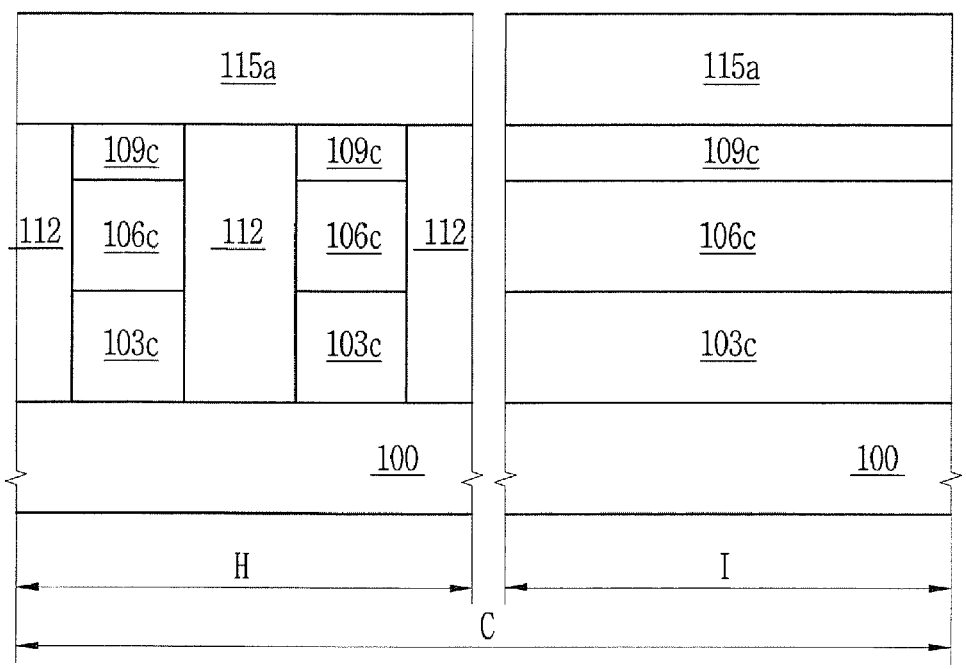

Referring to FIGS. 11C, 12C and 15, the first photoresist pattern (215 of FIG. 12B) may be removed. Subsequently, as illustrated in FIG. 4A, the sacrificial patterns (203a of FIG. 12B) may be removed to form empty spaces (S230). Then, a buried dielectric layer 222a may be formed on a surface of the substrate exposed through the empty spaces and the recessed region (S240). Then, a buried layer filling the empty spaces and the recessed region may be formed. The buried layer may be etched to form buried patterns 224 remaining in the empty spaces and a connection 224a remaining in the recessed region between the buried patterns 224 to connect the buried patterns 224 to each other (S250). The buried dielectric layer 222a and the buried patterns 224 may be respectively formed of the same material as the buried dielectric layer 122a and the buried patterns 124a described in FIG. 8A.

In another exemplary embodiment, the buried layer may be etched to completely remove the buried patterns 224 remaining in the empty spaces and the buried layer in the recessed region between the buried patterns 224. Therefore, the buried patterns 224 may be electrically separated from each other.

Referring to FIGS. 11D, 12D and 15, a second photoresist pattern 226 having an opening crossing the first hard mask pattern 209a and covering the second hard mask pattern 209b may be formed on the substrate having the buried patterns 224. The first hard mask pattern 209a and the preliminary active patterns 206a may be sequentially etched using the second photoresist pattern 226 as an etch mask to form active patterns 206b and a first hard mask pattern 210, which are sequentially stacked. Accordingly, the plurality of active patterns 206b may be formed on the buried patterns 224 (S260).

Meanwhile, the second photoresist pattern 226 may be formed of a hard mask pattern. The hard mask pattern may include substantially the same opening as the second photoresist pattern 226.

Referring to FIGS. 11E, 12E and 15, the second photoresist pattern 226 may be removed. Subsequently, a second isolation region 227 filling between the active patterns 206b may be formed. The first and second hard mask patterns 210 and 209b may be removed to expose the active patterns 206b and the active region 212a. Then, a recessed region may be formed by etching predetermined regions of the second isolation region 227 and the first isolation region 212 to expose sidewalls of the active patterns 206b. The recessed region may be formed in a region where a gate electrode will be formed in the following process.

Meanwhile, although it is not illustrated, while the sidewalls of the active patterns 206b are exposed, a sidewall of the active region 212 may be exposed.

Then, a first gate structure 236a crossing the active patterns 206b and a second gate structure 236b crossing the active region 212a may be formed (S270). The first gate structure 236a may include a first gate dielectric layer 230a and a first gate electrode 233a, which are sequentially stacked, and the second gate structure 236b may include a second gate dielectric layer 230b and a second gate electrode 233b, which are sequentially stacked.

First source and drain regions 245 may be formed in the active patterns 206b at both sides of the first gate structure 236a, and second source and drain regions may be formed in the active region 212a at both sides of the second gate structure 236b. Meanwhile, the first gate structure 236a may be formed to cover the sidewalls of the active patterns 206b.

As described above, according to the present invention, a system-on-chip having a bulk body element and a floating body element may be provided. In particular, the floating body element may be provided to have a back gate electrode of various structures. Therefore, circuits having various functions, i.e., systems may be provided on a chip.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:
1. A semiconductor device comprising:
a substrate including a bulk body element region and a floating body element region;
an isolation region defining an active region of the bulk body element region of the substrate and defining first buried patterns and first active patterns, which are sequentially stacked on a first element region of the floating body element region of the substrate;
a first buried dielectric layer between the first buried patterns and the substrate and between the first buried patterns and the first active patterns; and
at least one first connection that connects the first buried patterns to each other, wherein the first connection is at a level of the first buried patterns, wherein the first connection includes a thickness that is substantially the same as the first buried patterns, and wherein the first buried dielectric layer is between the first connection and the substrate.

2. The device of claim 1, wherein the first active patterns are self-aligned to the first buried patterns.

3. The device of claim 1, wherein the first buried patterns comprise an n-type doped semiconductor layer, a p-type doped semiconductor layer, an undoped semiconductor layer and/or a metal layer.

4. The device of claim 1, wherein the plurality of first active patterns are on each of the first buried patterns.

5. The device of claim 1, further comprising:
 second buried patterns and second active patterns, sequentially stacked on a second element region of the floating body element regions of the substrate and defined by the isolation region;
 a second buried dielectric layer between the second buried patterns and the substrate and between the second buried patterns and the second active patterns; and
 at least one second connection that connects the second buried patterns to each other and is a level of the second buried patterns.

6. The device of claim 5, wherein the second active patterns comprise thicknesses that are different than the first active patterns.

7. The device of claim 5, wherein the second buried patterns comprise thicknesses that are different than the first buried patterns.

8. The device of claim 5, wherein the second buried patterns comprise a material layer having characteristics that are different from the first buried patterns.

9. The device of claim 5, further comprising:
 first lower gate contact structures electrically connected to each of the first buried patterns; and
 a second lower gate contact structure electrically connected to the second buried patterns.

10. The device of claim 5, further comprising:
 third buried patterns and third active patterns, sequentially stacked on a third element region of the floating body element regions of the substrate and defined by the isolation region;
 at least one third connection that connects the third buried patterns to each other and covers sidewalls of the third active patterns; and
 a third buried dielectric layer between the third buried patterns and the substrate, between the third buried patterns and the third active patterns, between the third connection and the substrate and between the at least one third connection and the third active patterns.

11. The device of claim 1, further comprising:
 a passivation layer on the substrate; and
 an integrated circuit substrate on the passivation layer.

12. A semiconductor device comprising:
 buried patterns on a substrate;
 at least one connection extending from the buried patterns and connecting the buried patterns to each other;
 active patterns on the buried patterns;
 a buried dielectric layer between the buried patterns and the substrate, between the buried patterns and the active patterns, between the at least one connection and the substrate and between the at least one connection and the active patterns; and
 at least one gate structure directly on the active patterns,
 wherein the at least one connection includes a thickness that is substantially the same as the buried patterns, and wherein the buried dielectric layer is between the at least one connection and the substrate.

13. The device of claim 12, wherein the at least one connection is at a level of the buried patterns or covers sidewalls of the active patterns.

14. The device of claim 12, wherein the buried patterns are self-aligned to the active patterns.

15. The device of claim 12, wherein the plurality of active patterns are on each of the buried patterns.

16. The device of claim 12, wherein the active patterns comprises thicknesses that are different from each other.

17. The device of claim 12, wherein the buried patterns comprise thicknesses that are different from each other.

18. The device of claim 12, wherein the at least one gate structure covers the sidewalls of the active patterns.

19. The device of claim 12, further comprising a lower gate contact structure electrically connected to the buried patterns.

\* \* \* \* \*